US012574001B2

(12) United States Patent
Li et al.

(10) Patent No.: US 12,574,001 B2
(45) Date of Patent: Mar. 10, 2026

(54) BULK FILTER

(71) Applicant: GUANGDONG ZHINENG TECHNOLOGIES, CO. LTD., Guangzhou (CN)

(72) Inventors: Zilan Li, Guangzhou (CN); Lezhi Wang, Guangzhou (CN)

(73) Assignee: GUANGDONG ZHINENG TECHNOLOGIES, CO. LTD., Guangzhou (CN)

( * ) Notice: Subject to any disclaimer, the term of this patent is extended or adjusted under 35 U.S.C. 154(b) by 144 days.

(21) Appl. No.: 18/546,074

(22) PCT Filed: Feb. 10, 2022

(86) PCT No.: PCT/CN2022/075834
§ 371 (c)(1),
(2) Date: Aug. 10, 2023

(87) PCT Pub. No.: WO2022/171168
PCT Pub. Date: Aug. 18, 2022

(65) Prior Publication Data
US 2024/0120898 A1 Apr. 11, 2024

(30) Foreign Application Priority Data
Feb. 10, 2021 (CN) .......................... 202110185148.7

(51) Int. Cl.
*H03H 9/02* (2006.01)
*H03H 9/13* (2006.01)
(Continued)

(52) U.S. Cl.
CPC .... *H03H 9/02047* (2013.01); *H03H 9/02031* (2013.01); *H03H 9/133* (2013.01);
(Continued)

(58) Field of Classification Search
CPC ........ H03H 9/587; H03H 9/176; H03H 9/175; H03H 9/589; H03H 9/173; H03H 9/02062;
(Continued)

(56) References Cited

U.S. PATENT DOCUMENTS 6,822,535 B2 * 11/2004 Ma ........................... H03H 3/02
438/50
7,245,060 B2 * 7/2007 Yamada ............. H03H 9/02157
310/320
(Continued)

FOREIGN PATENT DOCUMENTS

CN 101771394 A 7/2010
CN 110224019 A 9/2019
(Continued)

*Primary Examiner* — Quan Tra
(74) *Attorney, Agent, or Firm* — Seed IP Law Group LLP

(57) ABSTRACT

A filter (100) includes a piezoelectric layer (105); a first electrode (108), disposed at a first vertical face of the piezoelectric layer (105) and configured to receive an electric signal; and a second electrode (109), disposed at a second vertical face of the piezoelectric layer (105) and configured to output an electric signal, where the first vertical face and the second vertical face are two opposite sides of the piezoelectric layer (105).

22 Claims, 30 Drawing Sheets

(51) Int. Cl.
  *H03H 9/17*          (2006.01)
  *H03H 9/58*          (2006.01)

(52) U.S. Cl.
  CPC ............ *H03H 9/173* (2013.01); *H03H 9/175*
          (2013.01); *H03H 9/176* (2013.01); *H03H*
                                *9/581* (2013.01)

(58) Field of Classification Search
  CPC ........ H03H 9/133; H03H 9/205; H03H 9/581;
          H03H 9/02047; H03H 9/02031; H03H
                                9/009
  See application file for complete search history.

(56)                    References Cited

U.S. PATENT DOCUMENTS

| | | | |
|---|---|---|---|
| 2005/0168104 A1 | 8/2005 | Bouche et al. | |
| 2014/0246956 A1 * | 9/2014 | Ballandras ............... | H03H 9/17 |
| | | | 29/25.35 |
| 2020/0328297 A1 * | 10/2020 | Li ...................... | H10D 62/8325 |

FOREIGN PATENT DOCUMENTS

| | | | |
|---|---|---|---|
| CN | 110581695 A | | 12/2019 |
| CN | 210405247 U | | 4/2020 |
| CN | 112039477 A | | 12/2020 |
| CN | 113659953 A | * | 11/2021 |

* cited by examiner

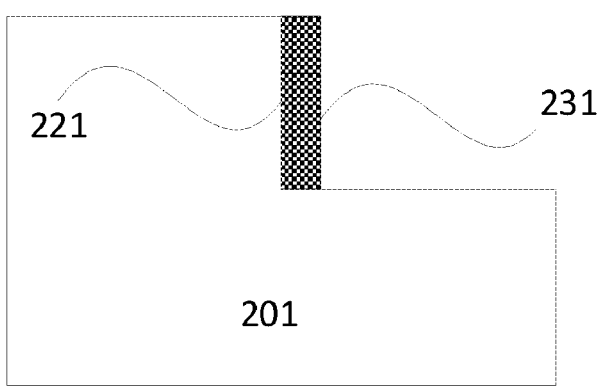
221
231
201
FIG. 2B
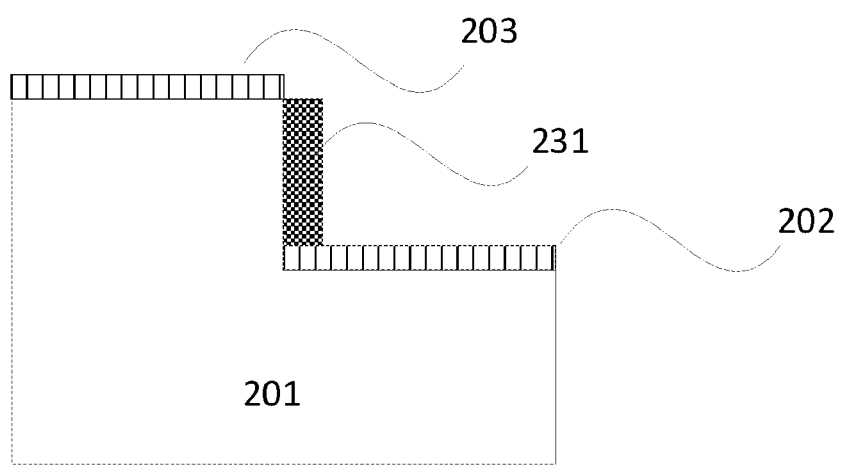
203
231
202
201
FIG. 2C
203
221
202
201
FIG. 2D

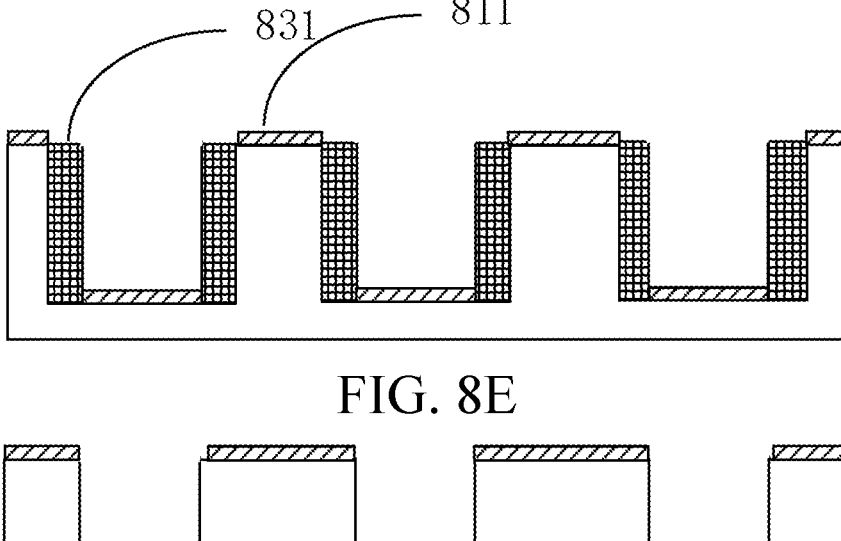
FIG. 8E
FIG. 8F
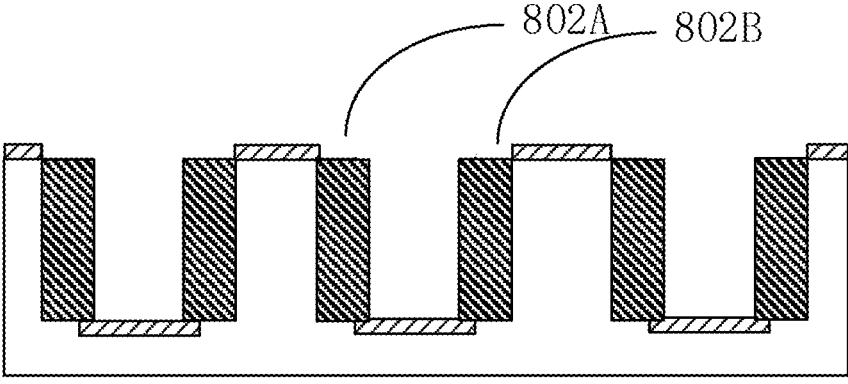
FIG. 8G 803A
803B

1712

1705

1800

BULK FILTER

FIELD OF THE INVENTION

This invention relates to the field of semiconductors, and in particular, to a bulk filter.

BACKGROUND OF THE INVENTION

A filter is a device for filtering frequencies. There are many types of filters, including dielectric filters, LC filters, SAW filters, BAW filters and so on. As a frequency difference between different frequency bands becomes smaller and smaller, signal selectivity of the filter is increasingly required. A quality factor Q of the filter represents an ability of signals in a passband to pass through and block signals outside the passband. The larger the Q, the narrower the passband bandwidth the filter can achieve, and the better the selectivity. In addition to Q, an insertion loss is also important. The insertion loss refers to an attenuation degree of the passband signal after passing the filter, that is, a signal power loss. The insertion loss is 1 dB, and then the signal power is attenuated by 20%; when the insertion loss reaches 3 dB, the signal power is attenuated by 50%. The SAW/BAW/FBAR filters become a main stream technique of RF filters due to characteristics such as good frequency band selectivity (high Q value) and low insertion loss.

In consideration of vibration isolation and heat dissipation of the resonant region, the BAW filter includes a BAW-SMR structure and an FBAR structure. However, the BAW-SMR and FBAR both has the problems of high process requirements and great difficulty for implementing, which do not facilitate the reduction of device costs and improvement of the integration degree.

SUMMARY OF THE INVENTION

For the technical problem existing in the prior art, this invention provides a filter, which includes a piezoelectric layer; a first electrode, disposed at a first vertical face of the piezoelectric layer and configured to receive an electric signal; and a second electrode, disposed at a second vertical face of the piezoelectric layer and configured to output an electric signal, where the first vertical face and the second vertical face are two opposite sides of the piezoelectric layer.

Regarding the filter above, a piezoelectric layer material is one of AlN, lithium tantalate, ZnO, and PZT.

Regarding the filter above, it further includes a substrate, which includes a vertical interface, where the piezoelectric layer is formed by epitaxial growth of the vertical interface.

Regarding the filter above, the substrate is a Si substrate, and the vertical interface is a Si(111) face; the substrate is a $Al_2O_3$ sapphire substrate, and the vertical interface is a $Al_2O_3$ (0001) face; the substrate is a SiC substrate, and the vertical interface is a SiC (0001) or (000-1) face; or the substrate is a GaN intrinsic substrate, and the vertical interface is a GaN intrinsic substrate (0001) or (000-1) face.

Regarding the filter above, it further includes a thermal conductive layer, where the substrate is between the piezoelectric layer and the thermal conductive layer.

Regarding the filter above, the substrate is subjected to a thinning treatment; or the thickness of the substrate is 500-3000 nm.

Regarding the filter above, a buffer layer is included between the vertical interface of the substrate and the piezoelectric layer.

Regarding the filter above, the piezoelectric layer is disposed above the buffer layer.

Regarding the filter above, it further includes a support layer, where the first vertical interface and the second vertical interface of the piezoelectric layer are roughly vertical to the support layer.

Regarding the filter above, the support layer includes a high thermal conductivity material.

Regarding the filter above, the support layer includes a metal or graphene.

Regarding the filter above, outside the first vertical interface, a first acoustic reflector or a first empty cavity is included.

Regarding the filter above, outside the second vertical interface, a second acoustic reflector or a second empty cavity is included.

Regarding the filter above, above or below the piezoelectric layer, a third acoustic reflector or a third empty cavity is included.

Regarding the filter above, the first electrode is electrically interconnected with the second electrode above the piezoelectric layer.

Regarding the filter above, the first electrode is electrically interconnected with the second electrode respectively above and below the piezoelectric layer.

Regarding the filter above, the first electrode is electrically interconnected with the second electrode below the piezoelectric layer.

According to another aspect of this invention, a filter network is provided and includes a plurality of filters above, where the filters above are integrated on a single chip.

Regarding the filter network above, the plurality of filters share a same substrate or support layer.

Regarding the filter network above, the plurality of filters above form a trapezoid configuration, a lattice configuration, or a trapezoid-lattice configuration.

According to another aspect of this invention, a semiconductor device is provided and includes: one or more filters above or one or more filter networks above; and one or more transistors; where one or more filters above or one or more filter networks above and one or more transistors are integrated on a single chip.

Regarding the semiconductor device above, the one or more filters above or one or more filter networks above and one or more transistors share a same substrate or support layer.

Regarding the semiconductor device above, the one or more transistors include HEMT or HHMT.

Regarding the semiconductor device above, the HEMT or HHMT includes a channel layer and a channel providing layer vertically disposed.

Due to different lattice orientations of the piezoelectric layer, a bulk filter process of the invention is simpler and the piezoelectric layer lattice quality is higher. The filter network and semiconductor device based on the bulk filter of the invention can be integrated in a single chip, so as to better facilitate the reduction of the size of the device.

BRIEF DESCRIPTION OF THE DRAWINGS

The following further describes the preferable embodiments of this invention in detail with reference to the accompanying drawings, where:

FIG. 1 is a schematic structural diagram of a BAW filter according to an embodiment of this invention.

FIG. 2A to FIG. 2H are schematic diagrams of preparation steps of a BAW filter according to an embodiment of this invention.

FIG. 8A to FIG. 8M are schematic diagrams of preparation steps of a BAW filter according to an embodiment of this invention.

EMBODIMENTS

Figures 1, 2A:
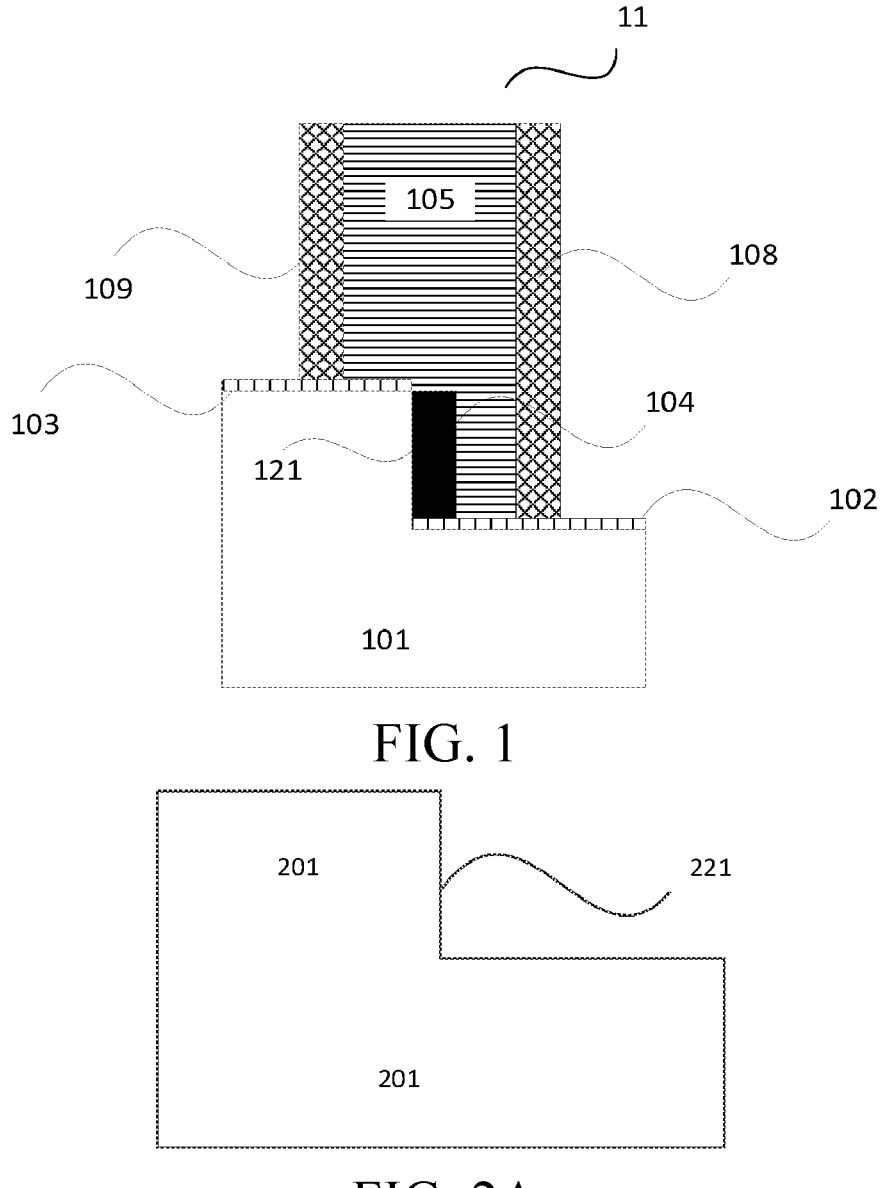

To make the objectives, technical solutions, and advantages of this invention clearer, the following would clearly and completely describe the technical solutions in the embodiments of this invention with reference to the accompanying drawings in the embodiments of this invention. Apparently, the described embodiments are merely some rather than all of the embodiments of this invention. All other embodiments obtained by a person of ordinary skill in the art based on the embodiments of this invention shall fall within the protection scope of this invention.

In the following detailed description, reference may be made to each drawings attached to the specification used as part of this application to illustrate particular embodiments of this invention. In the accompanying drawings, similar reference numerals describe broadly similar components in different drawings. Each specific embodiment of this application is described below in sufficient detail to enable a person of ordinary skills in the art with relevant knowledge and technology to implement the technical solution of this application. It shall be understood that other embodiments may also be used or structural, logical, or electrical changes may be made to the embodiments of this application.

Unless otherwise specified, spatial descriptions such as "above", "below", "top", and "bottom", refer to the direction relative to that shown in the drawings. It should be understood that the spatial descriptions used herein are for illustrative purposes only, and that the actual implementations of the structure described herein may be arranged spatially in any direction or in any manner without deviating from the advantages of specific embodiments of this disclosure.

This invention provides a BAW filter with a vertical structure. Different from the prior art, in the piezoelectric material of this invention, an acoustic wave is broadcast in a horizontal direction. That is to say, a lattice direction having a piezoelectric effect in the piezoelectric material of this invention is horizontal. Hence, a first electrode and a second electrode in contact with the piezoelectric material for providing input electric signals and output electric signals in the filter of this invention are also provided on a vertical face on both sides of the piezoelectric material transversely with respect to the piezoelectric material. The piezoelectric material of the vertical structure has fewer defects, which also facilitates to enable the manufacture process to be more simplified to improve yield.

FIG. 1 is a schematic structural diagram of a BAW filter according to an embodiment of this invention. As shown in the drawing, the filter 10 includes two regions with different heights on a substrate 101 to form a step-shape structure. Hence, a vertical interface 121 is formed between the two regions. The filter 100 further includes a piezoelectric layer 105 outside the vertical interface 121. In some embodiments, the height of the piezoelectric layer 105 may be higher than the height of the vertical interface 121. The filter 100 includes a first electrode 108 and a second electrode 109. The first electrode 108 and the second electrode 109 respectively form ohmic contact with two side faces of the piezoelectric layer 105, i.e., a first vertical face and a second vertical face. In some embodiments, an area of the first electrode 108 and the second electrode 109 can be the same as that of the two vertical faces of the piezoelectric layer 105, or an area of the first electrode 108 and the second electrode 109 can be equal to or less than that of the two vertical faces of the piezoelectric layer 105. In some embodiments, the filter of this application may include more than two electrodes, for example, a grounded electrode (not shown).

For the vertical structure BAW filter shown in FIG. 1, the piezoelectric layer 105 converts, at the first vertical face in contact with the first electrode 108, electric energy from the first electrode 108 into a mechanic energy, and converts, at the second vertical face in contact with the second electrode 109, the mechanic energy into the electric energy again. Since only the electric signal in the passband frequency range matching the inherent frequency of the piezoelectric layer 105 can pass through the filter 100, the frequency filtering is achieved. The piezoelectric layer thickness is inversely proportional to the resonant frequency of the filter. Selecting piezoelectric layers and/or electrodes with different thicknesses can implement the filters with different passband frequency ranges.

According to one embodiment of this invention, the material of the piezoelectric layer can be an III-IV-group ultra-wide band gap material, such as GaN and AlN, and can also be other piezoelectric materials, such as $LiTaO_3$, $LiNbO_3$, and $SiO_2$. In some embodiments of the text, a piezoelectric layer material is one of AlN, lithium tantalate, ZnO, and PZT. A person skilled in the art should understand that the piezoelectric material of this invention is not limited thereto.

According to an embodiment of this invention, the material of the substrate 101 may be Si, SiC, intrinsic GaN, or sapphire $Al_2O_3$. In some embodiments, the Si substrate with a lower cost and more mature process as compared with other materials is selected as an example to illustrate the technical solution of this invention. A person skilled in the art should understand that the piezoelectric material of this invention is not limited thereto.

A meltback effect would occur to Si in the substrate with GaN in the piezoelectric layer 105, to affect the growth of the piezoelectric layer 105. In some embodiments, the filter 100 further includes a nucleating layer (not shown) formed on the vertical face 121. In some embodiments, the filter 100 further includes a buffer layer 104. The buffer layer 104 is formed on a nucleating layer. The piezoelectric layer 105 is generated above the nucleating layer or the buffer layer 104. There are also special processes that can generate a wide band gap material directly on the vertical interface of the Si substrate without the use of the nucleating layer or buffer layers. Hence, in some embodiments, the nucleating layer and the buffer layer are not necessary.

In some embodiments, the material of the nucleating layer may be ALN, which covers the vertical interface 121 of the Si substrate 101 to avoid direct contact between the Si in the Si substrate 101 and the piezoelectric layer 105. In some embodiments, the buffer layer 104 can reduce the effect brought by lattice differences, reduce the effect brought by lattice constant and thermal expansion coefficient differences between the substrate 101 and the piezoelectric layer 105, effectively avoid situations of cracking of the nitride-epitaxial layer, and reduce defects in the lattice. The buffer layer material may be one or more of AlN, GaN, AlGaN, InGaN, AlInN, and AlGaInN.

According to an embodiment of this invention, a spacing layer 102 and a spacing layer 103 are included above the substrate 101. The spacing layer 102 and spacing layer 103 can separate the filter 100 from the substrate 101, and can reduce the influence of the substrate 101 on device performances, so as to obviously improve abilities of the device for improving voltage resistance and reducing dark currents. In some embodiments, the material of the spacing layer 102 and spacing layer 103 may be insulation materials such as SiN and $SiO_2$.

FIG. 2A to FIG. 2G are flow charts of a preparation method of a filter according to an embodiment of this invention. To better explain the solution of this invention, the embodiment takes a preparing process of the filter shown in FIG. 1 as an example.

The semiconductor device preparing method of this embodiment includes: at step 2001, form a vertical interface 221 on a substrate 201, as shown in FIG. 2A. Hence, two regions with different heights are formed on the substrate 201. The substrate 201 may be a Si substrate. As understood by a person skilled in the art, other substrates, such as intrinsic GaN, $Al_2O_3$ (sapphire), and SiC, may also implement similar structures.

At step 2002, grow a protective layer on the substrate and pattern as a vertical interface only covering an exposed substrate, as shown in FIG. 2B. In some embodiments, techniques for example LPCVD and the like are used on the substrate 201 to grow SiN, to form the protective layer 231. The protective layer 231 covers the entire substrate 201. Furthermore, the SiN on the substrate beyond the vertical surface 221 is removed by a vertical orientation etching technique, and only the SiN on the sidewall is retained.

At step 2003, form an insulation layer above the substrate 201, as shown in FIG. 2C. The insulation layer is grown on the substrate. In some embodiments, the insulation layer 202 can be formed on the entire substrate 201 by means of crystal growth. Otherwise, by depositing the insulation material and then thinning, the insulation layer with a desired thickness is obtained to form insulation layers 202 and 203. Due to the existence of the protective layer 231, the vertical interface has no growing insulation layer.

At step 2004, remove the protective layer, as shown in FIG. 2D. In some embodiments, SiN on the sidewall is removed by the selective etching technique, exposing the vertical interface 221 of the substrate 201 but retaining the spacing layers 202 and 203 of the substrate 201 at the same time.

A person skilled in the art should understand that other techniques also exist for forming similar structures on the substrate and exposing the vertical interface of the substrate at the same time. For example, the spacing layer is first formed on the substrate with the vertical interface, and then the insulation layer is patterned to expose the vertical interface of the substrate.

Figures 2E, 2F:
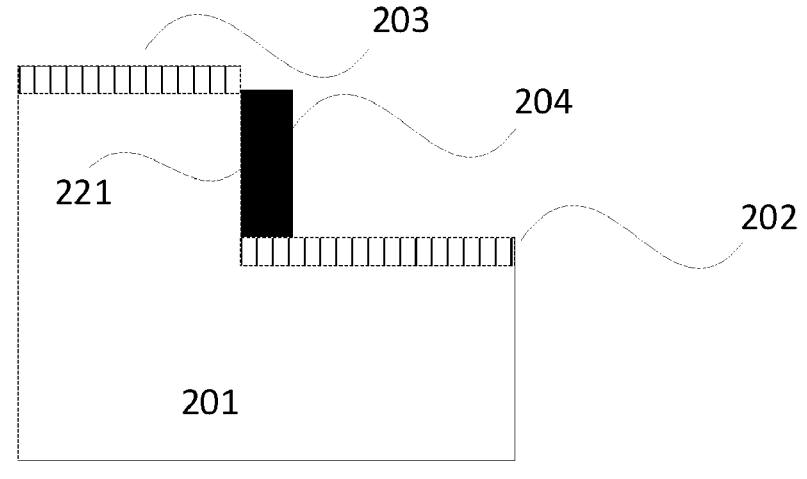
Figure 2G:
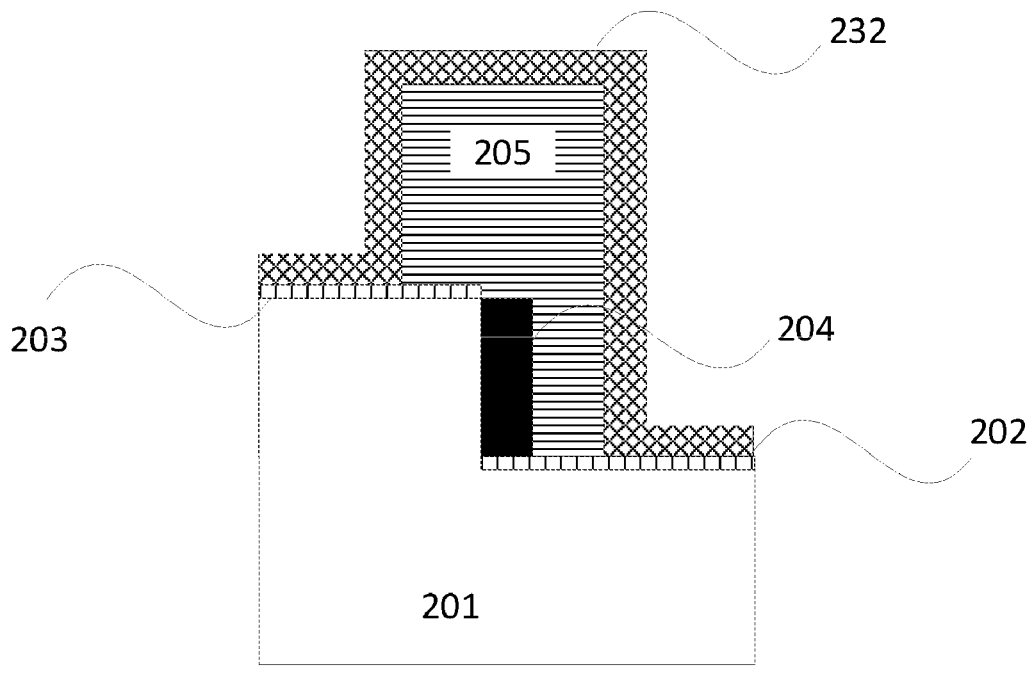

At step 2005, form the nucleating layer on the exposed vertical surface of the substrate 201, as shown in FIG. 2E.

Generally, the nucleating layer 204 is introduced for the Si substrate. As known by a person skilled in the art, GaN can directly be nucleated and grown on the $Al_2O_3$ (sapphire), SiC, or intrinsic GaN. Due to the difficulty of crystal quality control, the nucleating layer 204 is also often introduced in the process. In some cases, step 205 may not be included to introduce the nucleating layer 204 of low-temperature GaN or ALN, for example.

Because the ALN selection region growth ability is weak, there may also be a certain growth on the spacing layer, which has an adverse effect on semiconductor devices. In some embodiments, it is possible to remove the wafer after growing ALN and remove ALN elsewhere by etching with anisotropic properties, retaining only the ALN nucleating layer on the vertical surface, for example, using the dry etching with vertical downward ion bombardment. Since the ALN on the vertical surface is subjected to weaker ion bombardment and the ALN on the other face is subjected to stronger bombardment, the goal of retaining only the ALN on the vertical surface can be achieved.

At step 2006, as shown in FIG. 2F, form a piezoelectric layer 205 on the nucleating layer 204. For example, form the piezoelectric layer 205 on the nucleating layer 204 through epitaxial growth. In some embodiments, before this, it can include forming a buffer layer on the nucleating layer. As stated above, in the structure of the semiconductor device of this invention, the buffer layer is not necessary. In essence, properties of the buffer layer and the piezoelectric layer are very close, and can even be the same material (for example, ALN). In other words, the basic structure is the piezoelectric layer, while the buffer layer can be formed between the piezoelectric layer and the nucleating layer.

Figure 2H:
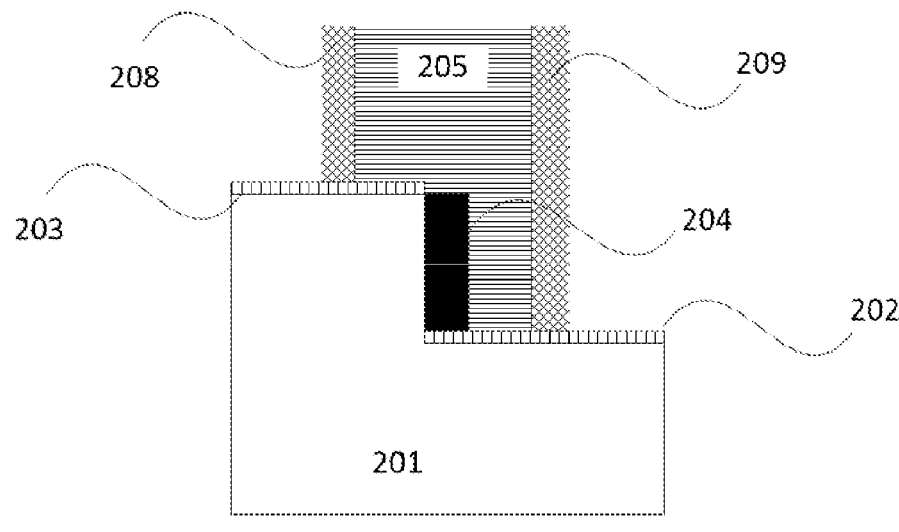

At step 207, respectively form a first electrode 208 and a second electrode 209 on a first vertical face and a second vertical face of two sides of the piezoelectric layer. In some embodiments, the first electrode 208 and the second electrode 209 in contact with the piezoelectric layer 205 are formed by LPCVD depositing metal 232 (as FIG. 2G) and patterning (as FIG. 2H).

In some embodiments, empty cavities are respectively formed outside the first electrode 208 and the second electrode 209. In some embodiments, Bragg reflectors are respectively formed outside the first electrode 208 and the second electrode 209. For example, high impedance parts are formed outside the first electrode 208 and the second electrode 209. A number of slots are formed in the high impedance part by the patterning technique, where the width of the plurality of slots is λ/4, while the spacing between the plurality of slots is also λ/4. Then a low impedance material is formed in the plurality of slots to form the reflector structure. In some other embodiments, the high impedance part is first formed outside the first electrode 208 and the second electrode 209. The high impedance part of λ/4 thickness is retained by the patterning techniques. A low impedance part is formed outside the retained high impedance part of λ/4 thickness. The low impedance part of λ/4 thickness is retained by the patterning technique. Then the high impedance part of λ/4 thickness and the low impedance part of λ/4 thickness are formed in the same way to form the reflector structure.

Compared with the traditional horizontal structure BAW filter, the vertical structure BAW filter of this invention occupies fewer chip area, more facilitates to achieve higher integration, and reduce the cost, and also facilitates to integrate with other structures. Furthermore, the vertical structure BAW filter of this invention has better heat dissipation ability, more accurate and mature processes in the isolation structure, and can greatly reduce the cost of the device.

Figure 3:
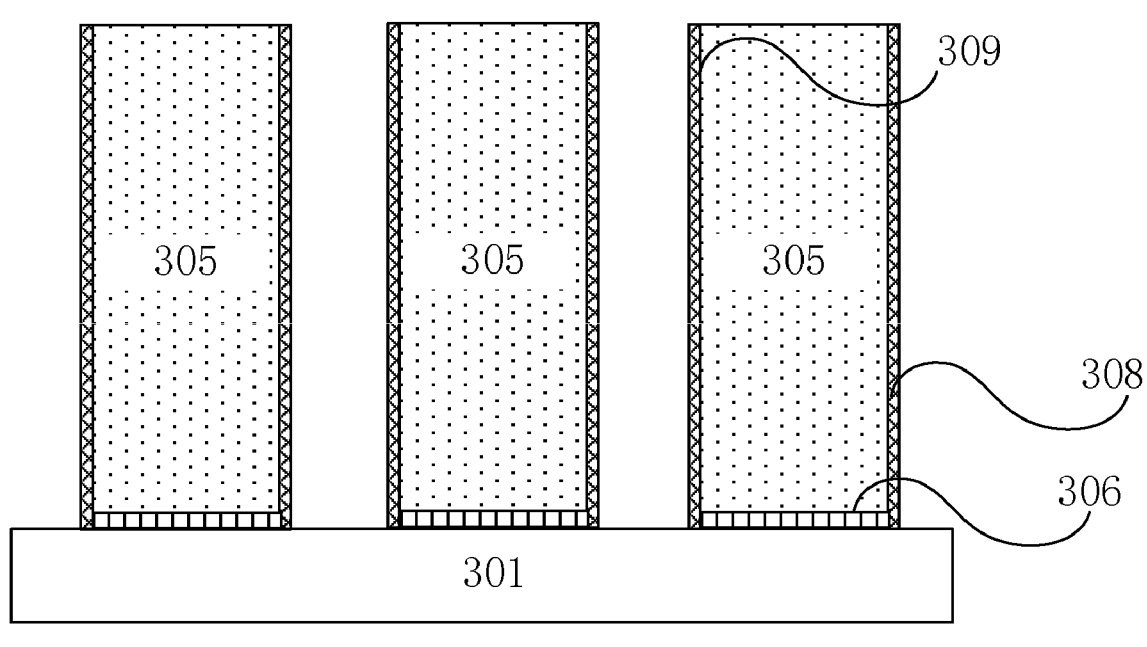
FIG. 3 is a schematic structural diagram of a BAW filter according to an embodiment of this invention.

FIG. 3 is a schematic structural diagram of a filter group according to another embodiment of this invention. As shown in the drawing, the filter group 300 includes: a substrate 301 and a plurality of filters, where each filter includes a piezoelectric layer 305 and an insulation layer 306 below the piezoelectric layer 305; a first electrode 308 and a second electrode 309 are both disposed at vertical faces of two sides of each piezoelectric layer 305. Different from the preceding embodiments, the filter of this embodiment no longer includes a vertical interface of a substrate. More importantly, the size of the piezoelectric layer 305 is defined through a trench. Hence, multiple piezoelectric layers 305 may have different sizes. Furthermore, the piezoelectric layer thickness defined by the trench may be more accurately controlled and a structure with a larger depth-width ratio can also be formed.

In some embodiments, a thermal conductive layer can be included below the substrate 301. In this way, the substrate 301 would be located between the piezoelectric layer 305 and the thermal conductive layer. The thermal conductive layer may be high thermal conductivity materials such as metal or graphene. In some embodiments, the substrate 301 is thinned. Upon thinned, the thickness of the substrate 301 is between 500-3000 nm, so as to provide better heat dissipation capability.

Figure 4A:
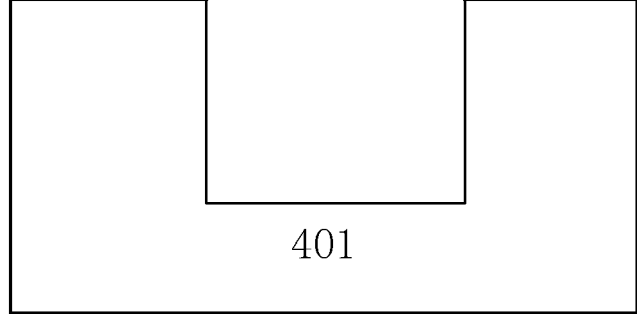
FIG. 4A to FIG. 4C are schematic diagrams of preparation steps of a BAW filter according to an embodiment of this invention.
Figure 4B:
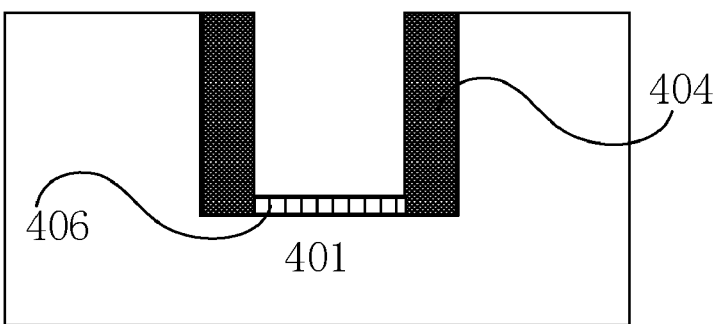
Figure 4C:
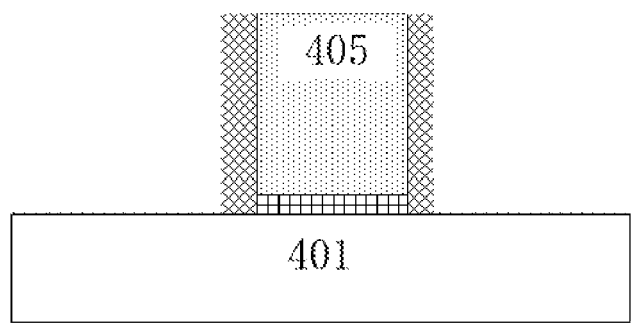

FIG. 4A to FIG. 4C show a preparing process of a filter of the embodiment of FIG. 3. Multiple filters with different sizes can be made on the same substrate at the same time in a similar mode. The filter preparing method of this embodiment includes the following steps: at step 410, form two vertical interfaces on a substrate 401, as shown in FIG. 4A. For example, through etching trenches in a vertical direction, three regions with different heights are formed on the substrate 401. At step 420, as shown in FIG. 4B, form an insulation layer and a nucleating layer on the substrate. At step 430, form a piezoelectric layer 405 in the trench. In an embodiment, the piezoelectric layer 405 can be formed on the nucleating layer 404 through epitaxial growth and the entire trench can be gradually filled. Hence, the size of the piezoelectric layer 405 would be formed completely according to the size of the trench. At step 440, pattern and remove the structure at two sides of the piezoelectric layer 405. By lithography, the corresponding substrate 401 and nucleating layer 404 are removed and the first electrode and second electrode are further formed on both sides of the piezoelectric layer 405, as shown in FIG. 4C. Therefore, the piezoelectric layer of the filter can be formed through the vertical interface of the trench on the substrate, and the final filter no longer includes the vertical interface of the trench.

Figure 5:
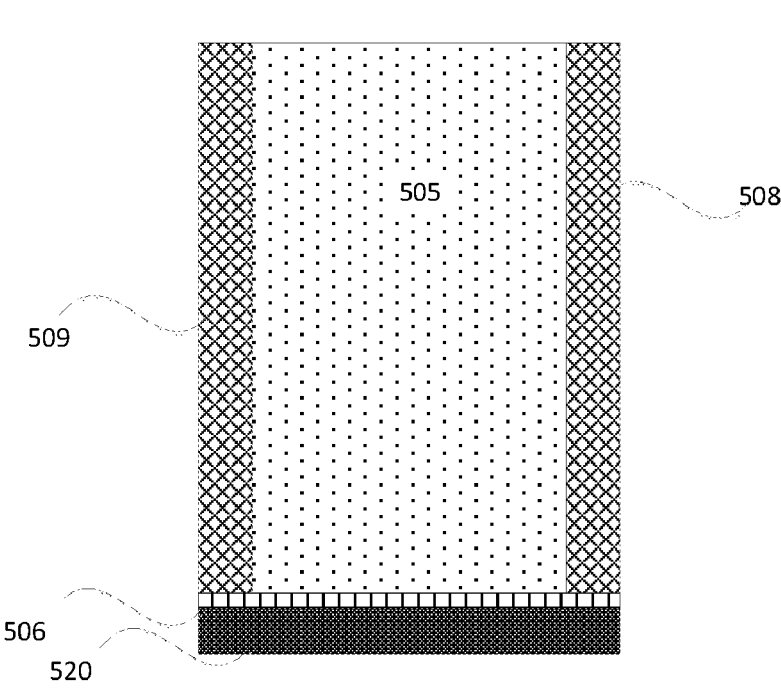
FIG. 5 is a schematic structural diagram of a BAW filter according to an embodiment of this invention.

FIG. 5 is a schematic structural diagram of a filter according to an embodiment of this invention. As shown in the drawing, the filter 500 includes a support layer 520, a piezoelectric layer 505, an insulation layer 506, a first electrode 508, and a second electrode 509. Roughly similar to the structure of the preceding embodiments, the filter of this embodiment no longer includes a substrate and replaces same with a support layer.

Figure 6A:
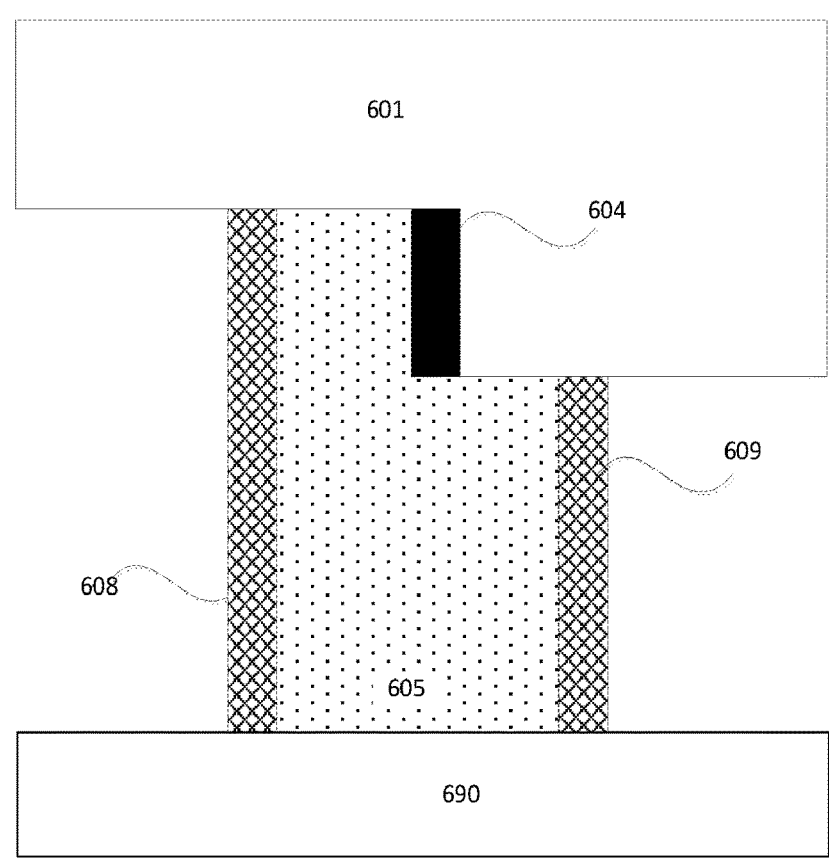
FIG. 6A to FIG. 6D are schematic diagrams of preparation steps of a BAW filter according to an embodiment of this invention.
Figure 6B:
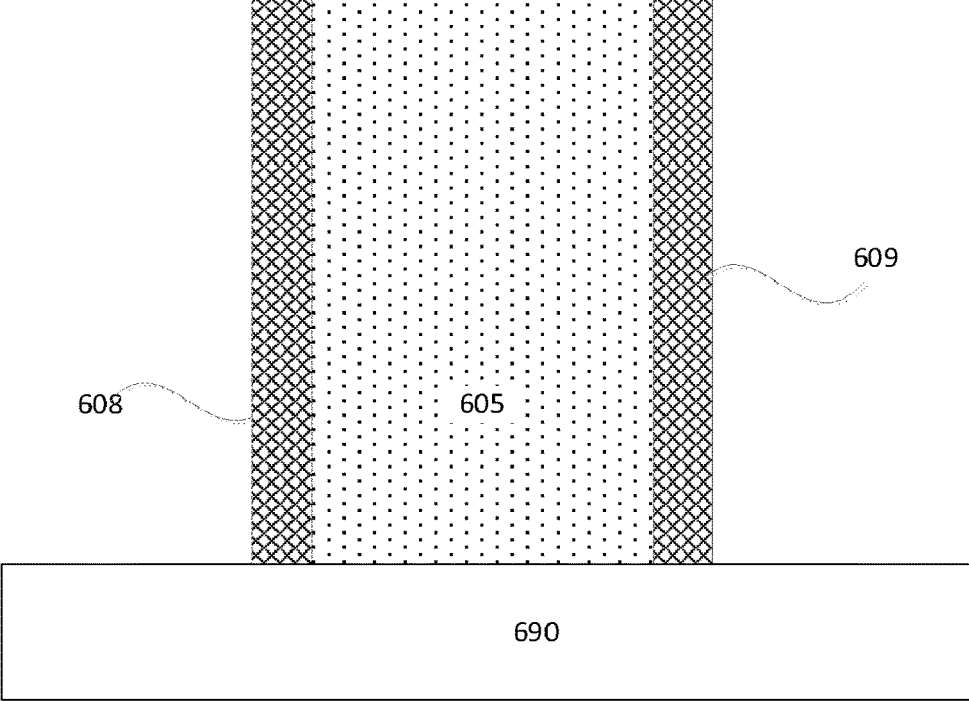
Figure 6C:
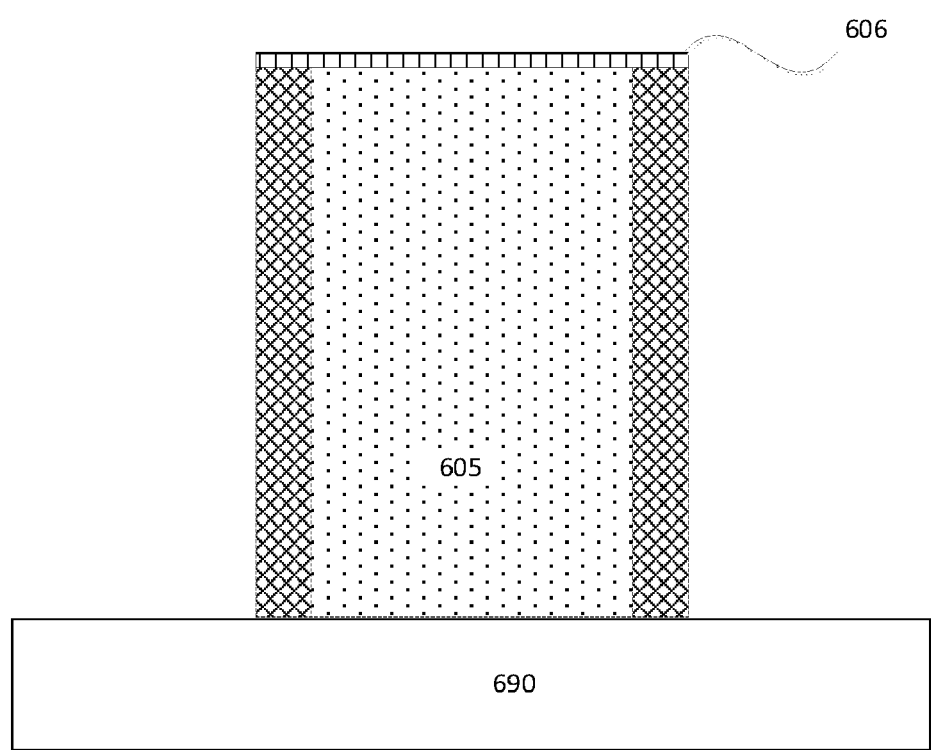
Figure 6D:
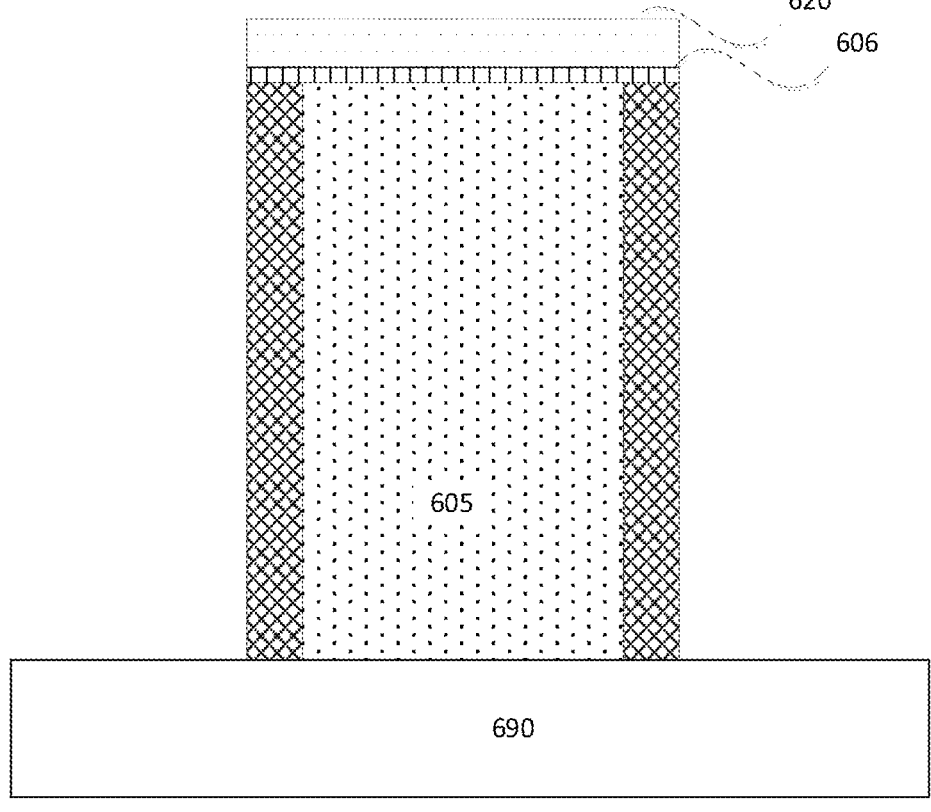

The filter of this embodiment can be made using the following method: at step 6100, invert the structure shown in FIG. 1, and then fix same on a temporary support layer 690, as shown in FIG. 6A. At step 6200, remove the substrate, the nucleating layer, and a part of the piezoelectric layer 605, as shown in FIG. 6B. At step 6300, form an insulation layer 606 on a remaining structure, as shown in FIG. 6C. At step 6400, form a support layer 620 on the insulation layer 606, as shown in FIG. 6D. Finally, form a support layer 620 using deposition, epitaxial growth, or other techniques and remove the temporary support layer 690. In some embodiments, the support layer 620 may be high thermal conductivity materials such as metal or graphite. In this way, a large amount of heat generated during the working process of the device can be transmitted to the outside through the support layer, so as to provide a good heat dissipation effect.

Figure 7:
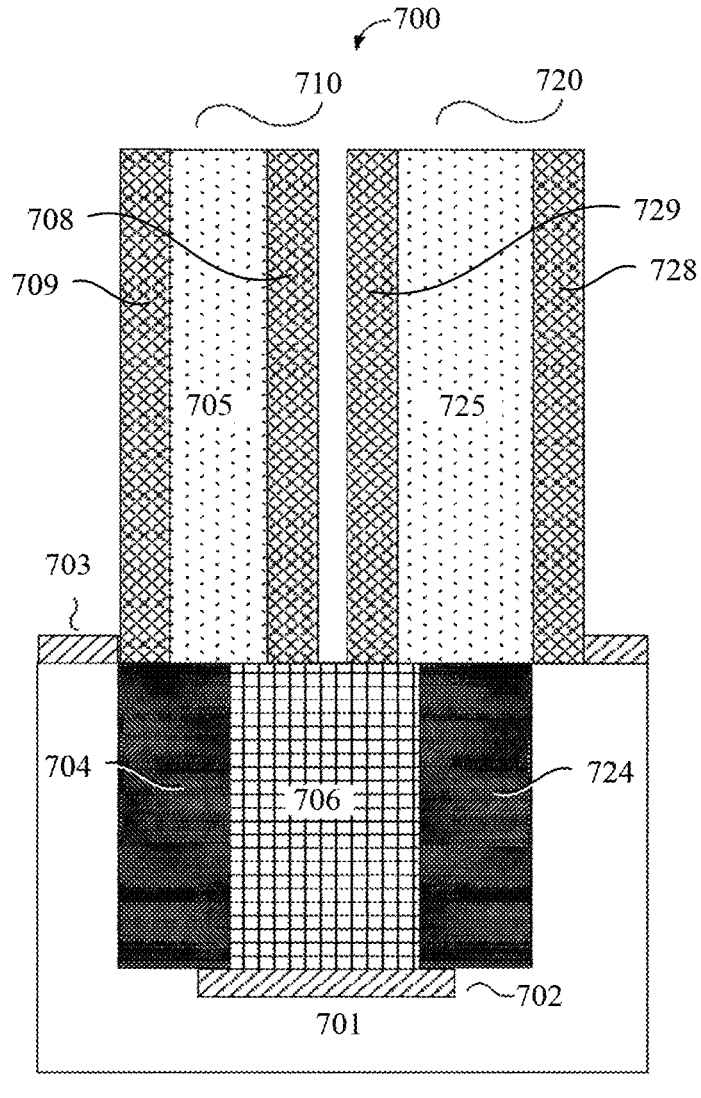
FIG. 7 is a schematic structural diagram of a BAW filter according to an embodiment of this invention.

FIG. 7 is a schematic structural diagram of a filter group according to an embodiment of this invention. As shown in the drawing, the filter group 700 includes a first filter 710 including a piezoelectric layer 705, a first electrode 708, and a second electrode 709, and a second filter 720 including a piezoelectric layer 725, a first electrode 728, and a second electrode 729. Different from the preceding embodiments, the piezoelectric layers 705 and 725 are formed above the nucleating layers 704 and 724, so that defects of the piezoelectric layers are fewer; moreover, two piezoelectric layers 705 and 725 with different widths can be formed at the same time, conveniently implementing the integration of filters with different frequencies. In some embodiments, the filters 710 and 720 are also adapted to removing the substrate using the mode shown in the embodiment of FIG. 6, so as to provide a better heat dissipation capability.

Figure 8A:
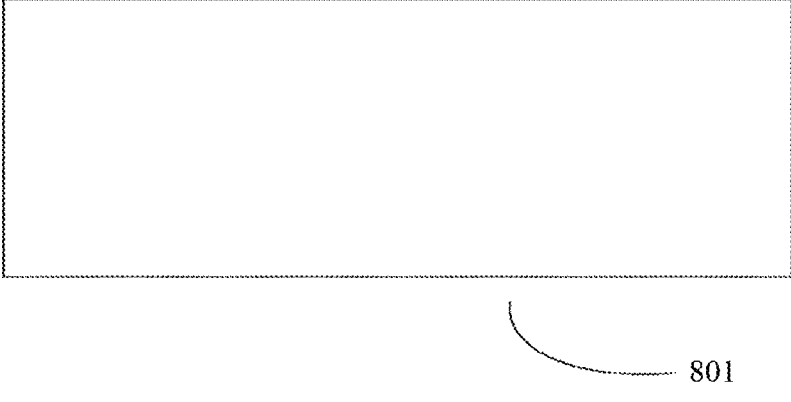

The filter of this embodiment can adopt the following preparation method: at step 8001, as shown in FIG. 8A, provide a Si substrate 801.

Figure 8B:
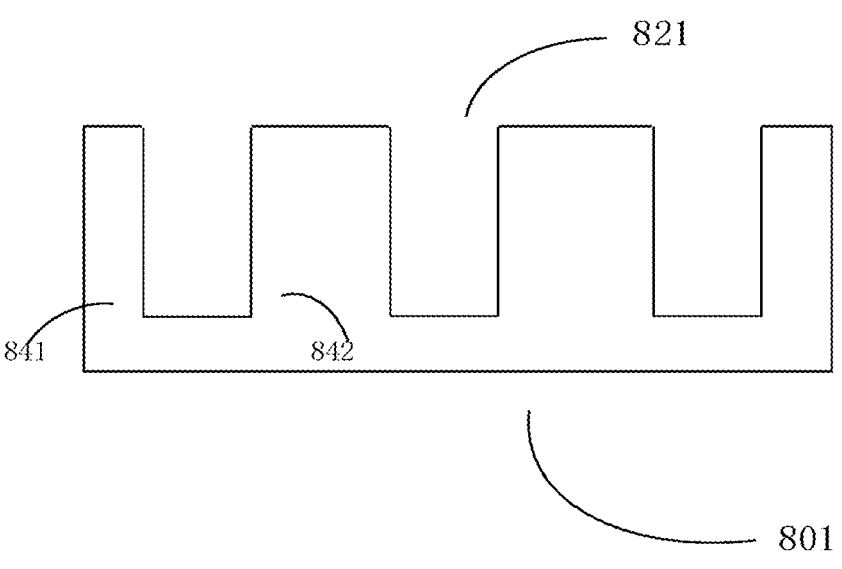

At step 8002, form a plurality of first trenches on the substrate, as shown in FIG. 8B. For example, the substrate 801 is etched by lithography technology, and a plurality of rectangular first trenches 821 are formed on the substrate 801, exposing the vertical interfaces 841 and 842 of the substrate 801; wherein the first trench 821 inner substrate vertical interfaces 841 and 842 are the (111) faces of the Si substrate. This field also includes other modes to obtain the first trenches 821. These method can also be applied herein.

In some embodiments, the number of the first trenches disposed at the same substrate is determined according to specific integration level and other requirements, and 3 trenches are taken as an example for explanation herein. The method involved in this invention can pre-construct the shape and size of the trench according to actual requirements.

Figure 8C:
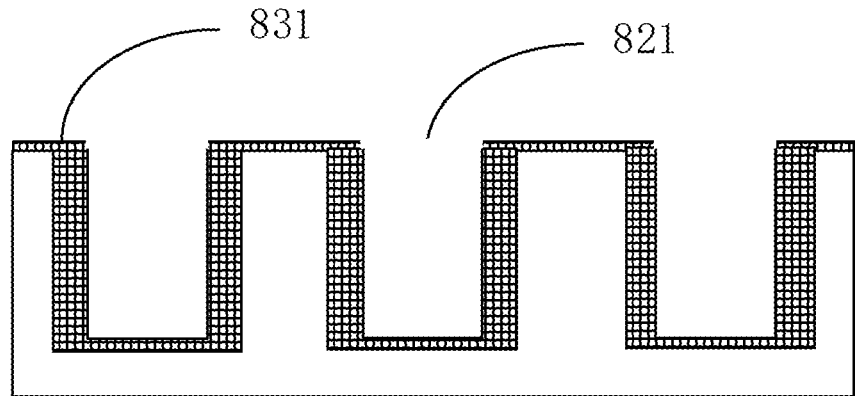

At step 8003, form a protective layer 831 on the first trench surface on the substrate, as shown in FIG. 8C. The SiN protective layer 831 is grown on the substrate 801 using techniques such as LPCVD to cover the surfaces of the substrate 801 and the plurality of trenches 821.

Figure 8D:
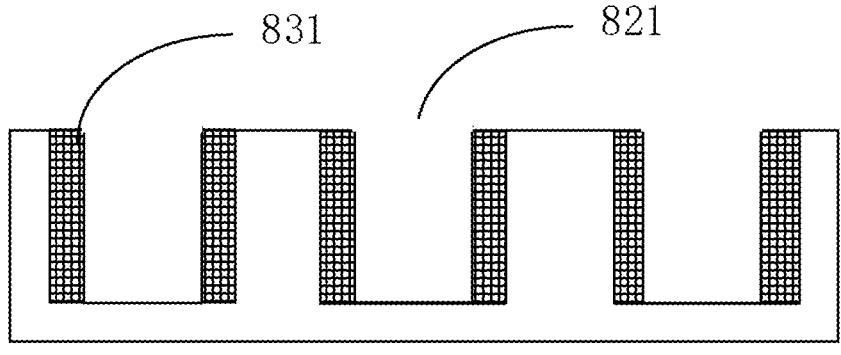

At step 8004, remove the protective layer 831 horizontally extended on the surface on the first trench bottom face and the substrate, and reserve the protective layer 831 of a first trench sidewall, as shown in FIG. 8D. Through an etching technique with vertical orientation, only the SIN-formed protective layer 831 is retained on the vertical interfaces 841 and 842, exposing the Si substrate 801 on the bottom face of the trench 821. The protective layer 831 covers the substrate vertical interfaces 841 and 842 of the substrate trench 821.

At step 8005, form a first separation layer on the substrate and the first trench, as shown in FIG. 8E. A separation layer 811 is covered on the bottom face of the first trench 821. In some embodiments, $SiO_2$ may be formed using oxidation techniques, thereby forming the first separation layer 811 on the substrate 801. Since the vertical interfaces 841 and 842 of the substrate 801 are covered with the protective layer 831, the vertical interfaces 841 and 842 of the substrate 801 is basically free of growth of the separation layer 811.

At step 8006, remove the protective layer of the trench sidewall, as shown in FIG. 8F. The separation layer 811 above the substrate 801 is covered with a mask, and the protective layer 831 on the sidewall of the first trench 821 is partially etched by lithography. For example, etching may include the removal of part of the sidewall of the first trench 821. After etching, the vertical interfaces 841 and 842 of the substrate 801 are exposed. Other methods also exist in the art to expose the vertical interface of the substrate by removing the protective layer. These methods can also be applied herein.

At step 8007, the first nucleating layer and the second nucleating layer are formed at the vertical interface, as shown in FIG. 8G. The first nucleating layer and the second nucleating layer 802A and 802B are grown on the vertical surfaces 841 and 842 exposed from the substrate 801. The nucleating layers 802A and 802B include ALN. In some embodiments, after forming the ALN, one or more buffer materials of The buffer layer material may be one or more of AlN, GaN, AlGaN, InGaN, AlInN, and AlGaInN can further be grown. In some embodiments, the nucleating layer would also grow in the vertical direction the same time as extending and growing horizontally (not shown). By controlling the process parameters, the growth of nucleating layer can be made as horizontal as possible. Although there is growth in the vertical direction, it would not affect the structure of the device.

Figure 8H:
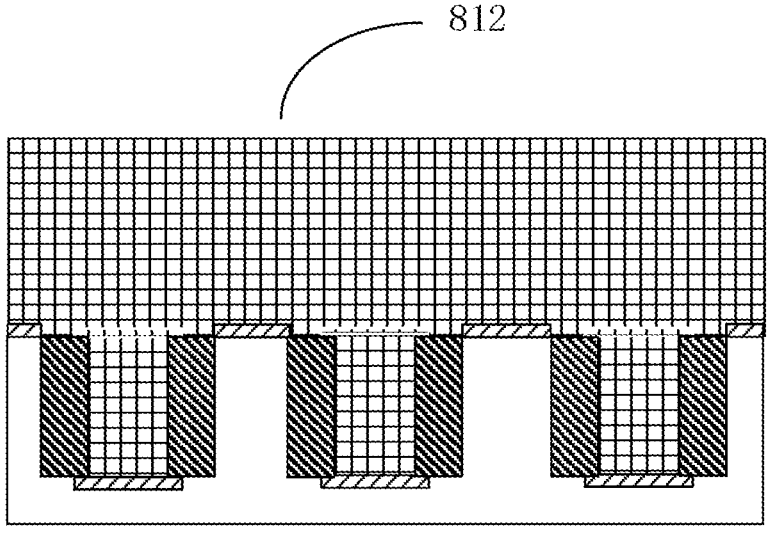

At step 8008, a shielding layer is formed on the surface of the entire device, as shown in FIG. 8H. On the structure shown in FIG. 8GA and FIG. 8GB, a $SiO_2$ shielding layer 812 is formed by a deposition process. The shielding layer 812 fills the trench 821 and forms a $SiO_2$ shielding layer 812 of a certain height on the substrate. In some embodiments, if a semiconductor device with a large aspect ratio is desired, the height of shielding layer 812 is increased accordingly.

Figure 8I:
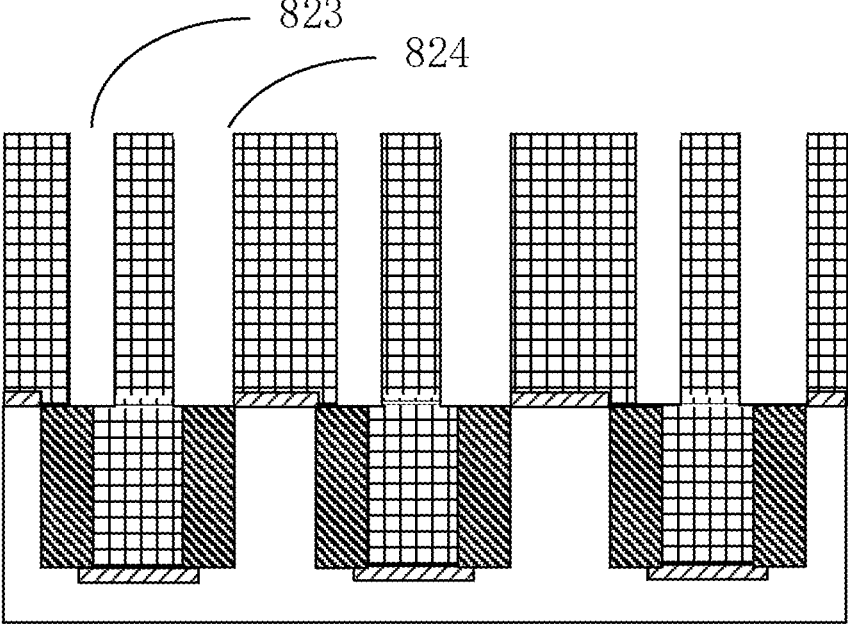

At step 8009, pattern the shielding layer to form a plurality of second trenches, as shown in FIG. 8I. Through the vertical etching technique, vertical second trenches 823 and 824 are etched on the shielding layer 812. Basically, the second shielding layers 823 and 824 define the height of the second layer of the semiconductor device and limit the height of the nucleating layer at the first layer. Upper surfaces of the nucleating layers 802A and 802B are exposed at the bottom of the trenches 823 and 824.

A person skilled in the art should note that the nucleating layers 802A and 802B are formed at the Si substrate (111) face, and therefore, the nucleating layers 802A and 802B have hexagonal symmetry. After exposing the upper surfaces of the nucleating layers 802A and 802B, other structures formed in the trenches 823 and 824 also have hexagonal symmetry.

Figures 8J, 8K:
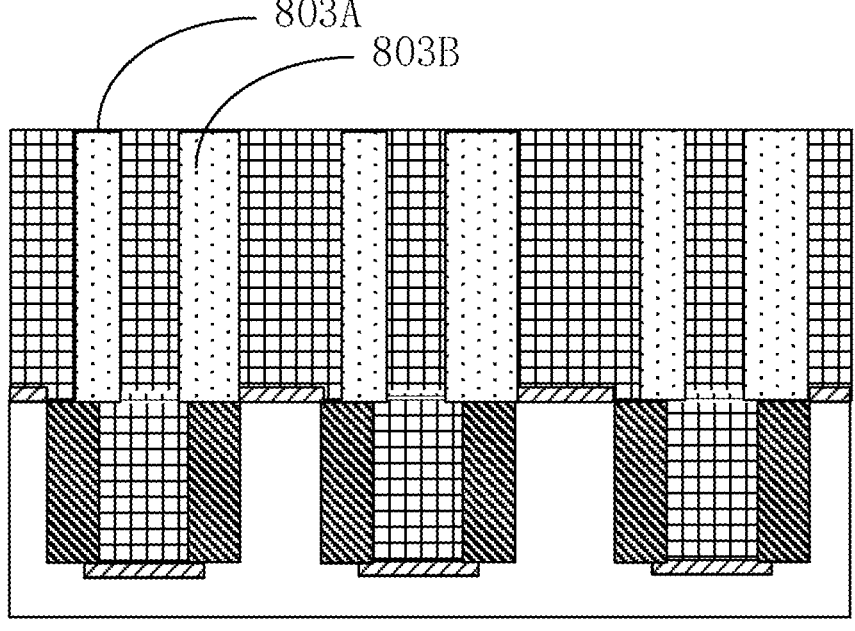

At step 8010, grow a first piezoelectric layer and a second piezoelectric layer in the plurality of second trenches, as shown in FIG. 8J. In some embodiments, as shown in the drawings, the nucleating layers 802A and 802B form the first piezoelectric layer 803A and the second piezoelectric layer 803B through epitaxial growth. The first piezoelectric layer 803A and the second piezoelectric layer 803B have different widths and thus have different passband frequency ranges. For traditional epitaxial growth, its horizontal growth condition is not easy to control, so it is difficult for the semiconductor structure to maintain complete vertical growth, and multiple growth planes may appear. The structure involved in this invention can maintain continuous growth on the same side and improve the electrical characteristics of the device.

At step 8011, remove the shielding layer above the substrate, and expose the piezoelectric layer, as shown in FIG. 8K. The shielding layer above the substrate is removed by vertical orientation etching, exposing the piezoelectric layer. In some embodiments, a small part of insulation layer on the substrate may be retained so that the substrate is not exposed.

Figure 8L:
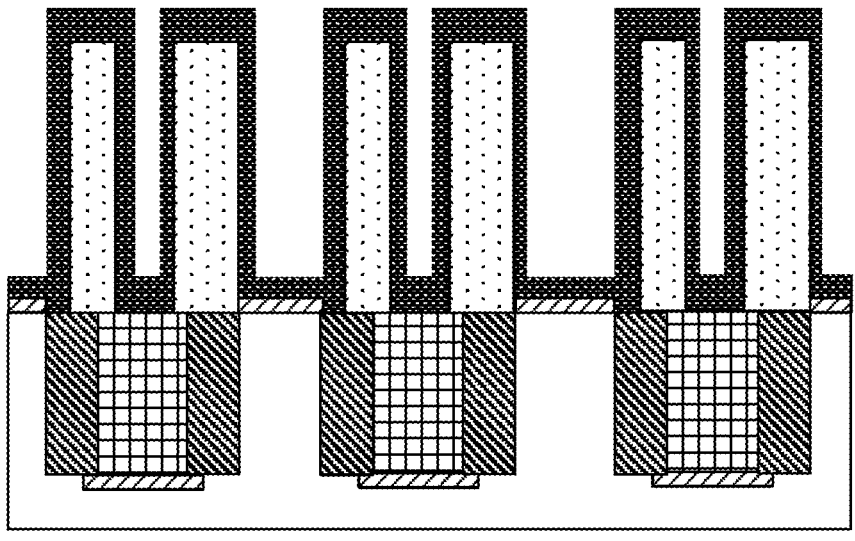

At step 8012, a conductive layer is deposited on the piezoelectric layer, as shown in FIG. 8L. The conductive layer is deposited on the piezoelectric layer by an electrode deposition method.

Figure 8M:
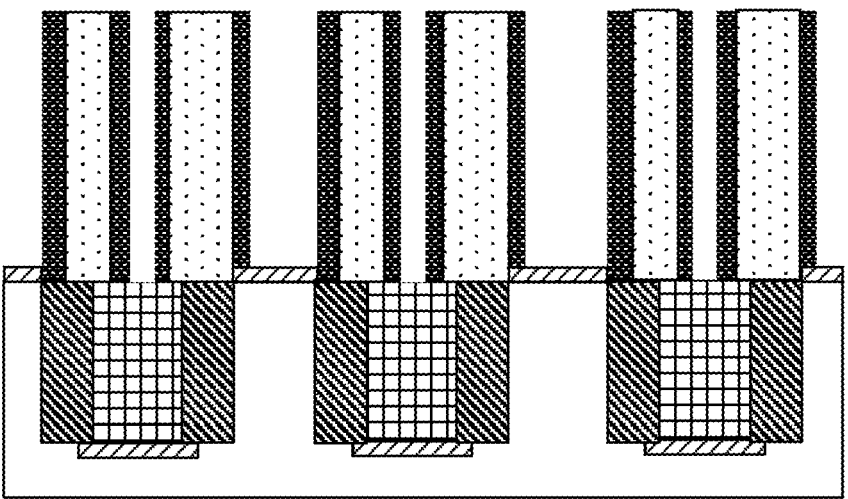

At step 8013, pattern the conductive layer to form first and second electrodes at left and right sides of each piezoelectric layer, as shown in FIG. 8M. Through the etching technology, the conductive layer on the left and right sides of the piezoelectric layer is retained to form the first electrode and the second electrode.

To provide the performance of the filter, in some embodiments, a first acoustic reflector or a first empty cavity is included outside the first vertical interface of the piezoelectric layer of this invention; a second acoustic reflector or second empty cavity is included outside the second vertical interface, thus confining the acoustic wave into the piezo-electric layer, reducing the attenuation of the signal as well as the generation of heat.

Figure 9A:
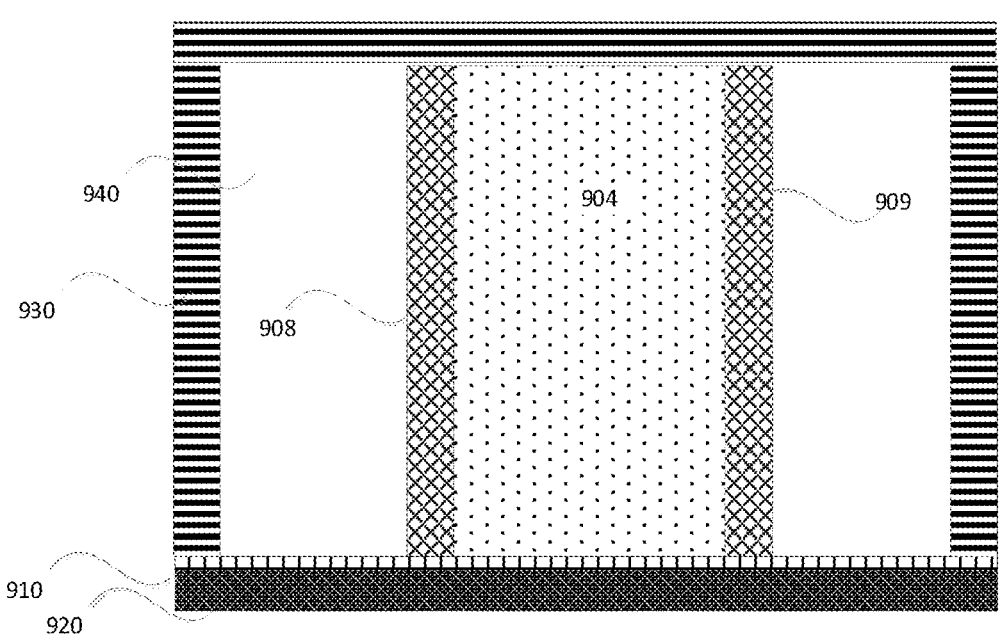
FIG. 9A is a schematic structural diagram of a BAW filter according to an embodiment of this invention.
Figure 9B:
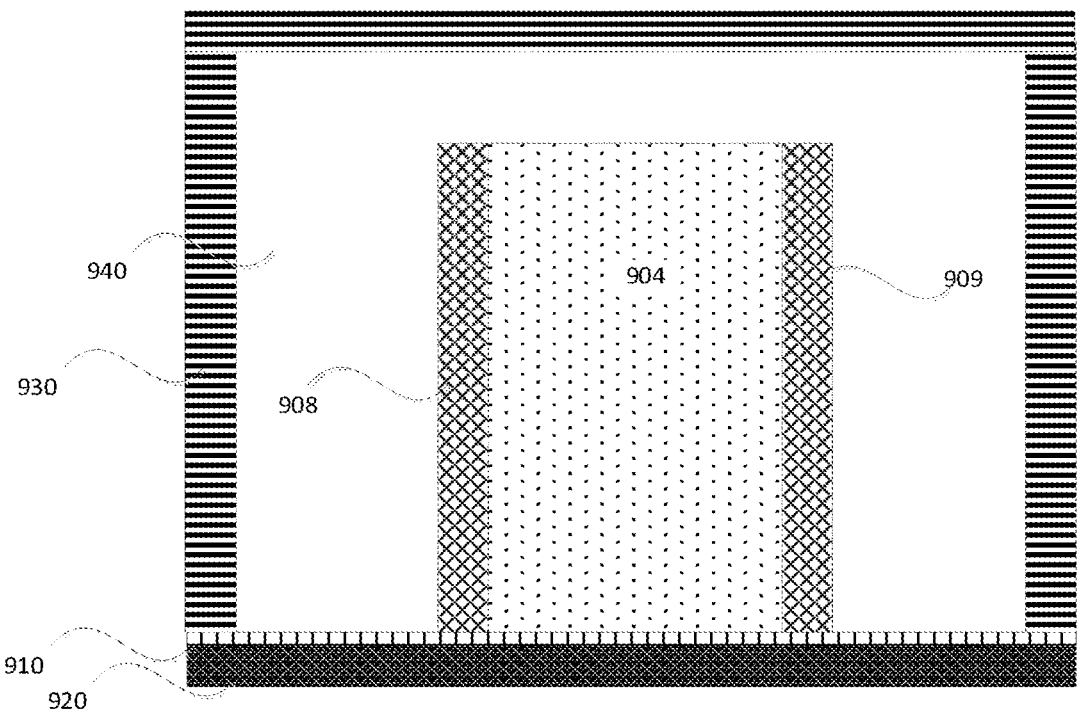
FIG. 9B is a schematic structural diagram of a BAW filter according to an embodiment of this invention.

FIG. 9A is a schematic diagram of a filter according to an embodiment of this invention. Structures similar to those in the previous embodiments will not be repeated. As shown in the drawing, the filter 900 includes a bottom layer 910, a protective layer 930, and a chamber 940 formed between the two. The piezoelectric layer 904, the first electrode 908, and the second electrode 909 are formed between and in contact with the bottom layer 910 and the protective layer 930. FIG. 9B is a schematic diagram of a filter according to another embodiment of this invention, which is similar to the filter in FIG. 9A, except that the piezoelectric layer 904, the first electrode 908, and the second electrode 909 are only in contact with the bottom layer 910 and not in contact with the protective layer 930. In some embodiments, the bottom layer 910 may be a substrate or a thinned substrate. A thermal conductivity layer 920 may be included in addition to the thinned substrate. In some other embodiments, the bottom layer may also be directly a support layer formed from a highly thermally conductive material after the substrate is removed, thus providing a better heat dissipation capability.

In this embodiment, empty cavities disposed on both sides of the piezoelectric layer 904 form an FBAR-like structure. When the filter is operating, a mechanical wave formed by the piezoelectric layer 904 propagates only between the electrode 908 and electrode 909. Compared with the tradi-tional structure, there is no other parasitic wave and other clutter interference, the filtering effect is better, and the quality factor is higher.

Figure 9C:
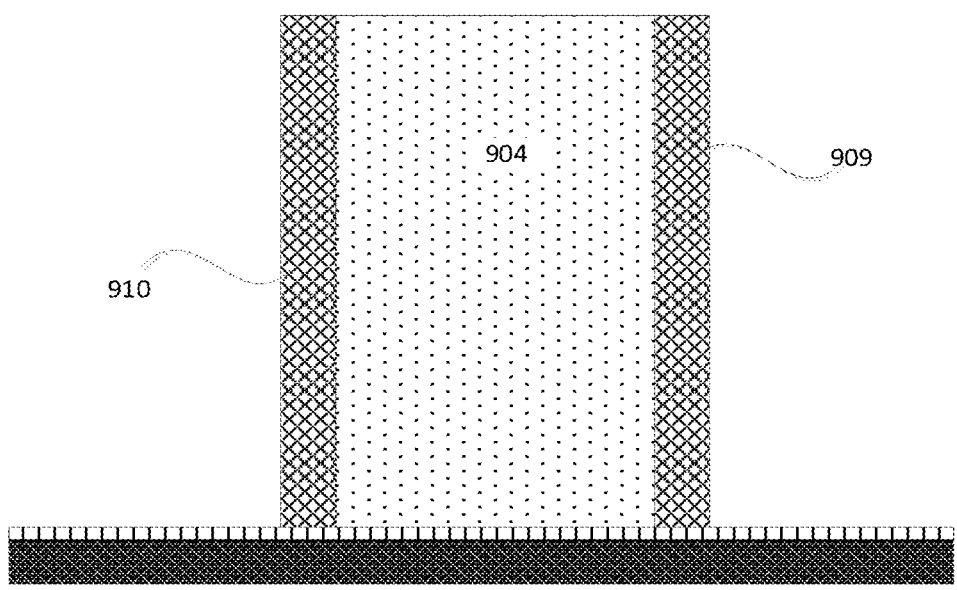
FIG. 9C to FIG. 9G are schematic diagrams of preparation steps of a BAW filter according to an embodiment of this invention.
Figure 9D:
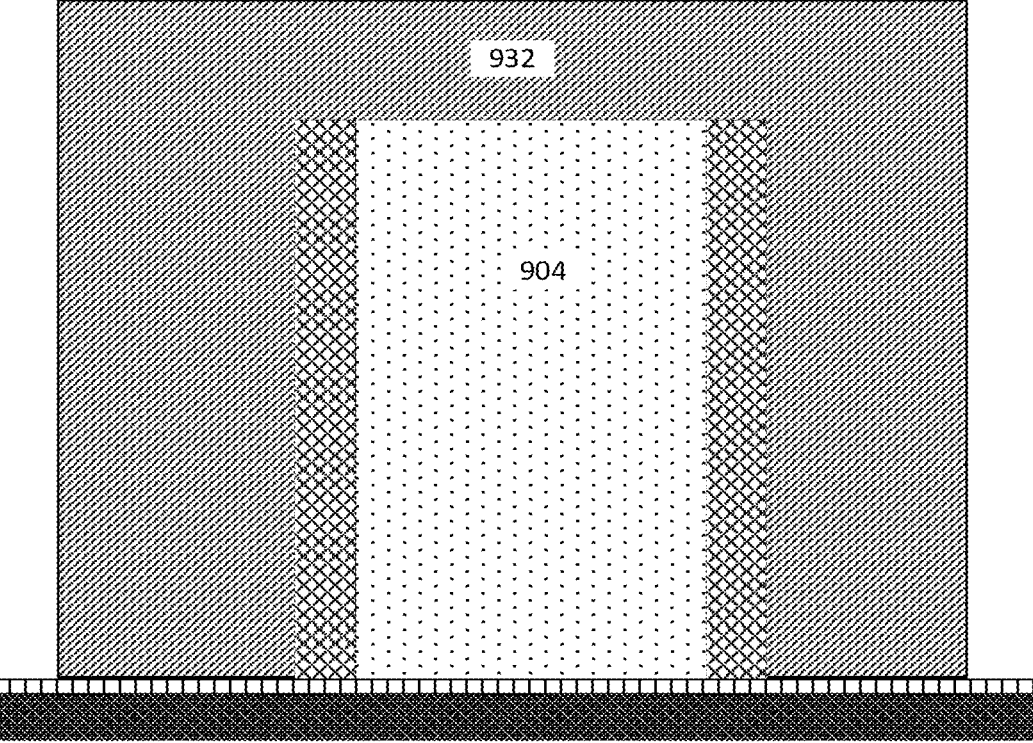

The filter in the embodiment shown in FIG. 9B may adopt the following manufacturing method: at step 9001, form a sacrificial layer 932 on the filter shown in FIG. 9C, as shown in FIG. 9D. For example, by deposition or epitaxial growth, the sacrificial layer 932 is formed to completely enclose the piezoelectric layer 904, the first electrode 908, and the second electrode 909. In some embodiments, the sacrificial layer 932 may be polymethyl methacrylate (PMMA), poly-acrylic acid (PAA), GaAs, etc.

Figure 9E:
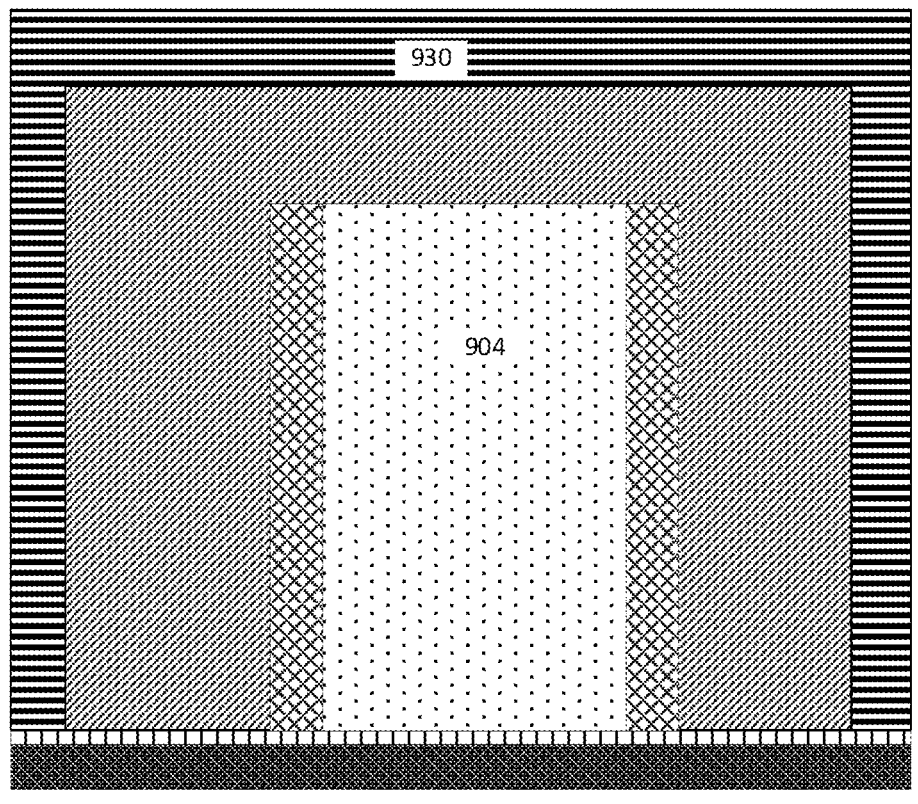

At step 9002, form a protective layer 930 on the sacrificial layer, as shown in FIG. 9E. In some embodiments, tech-niques such as LPCVD are used on the sacrificial layer 932 to grow $SiO_2$ or SiN, to form the protective layer 930. The protective layer completely wraps the sacrificial layer 932.

Figure 9F:
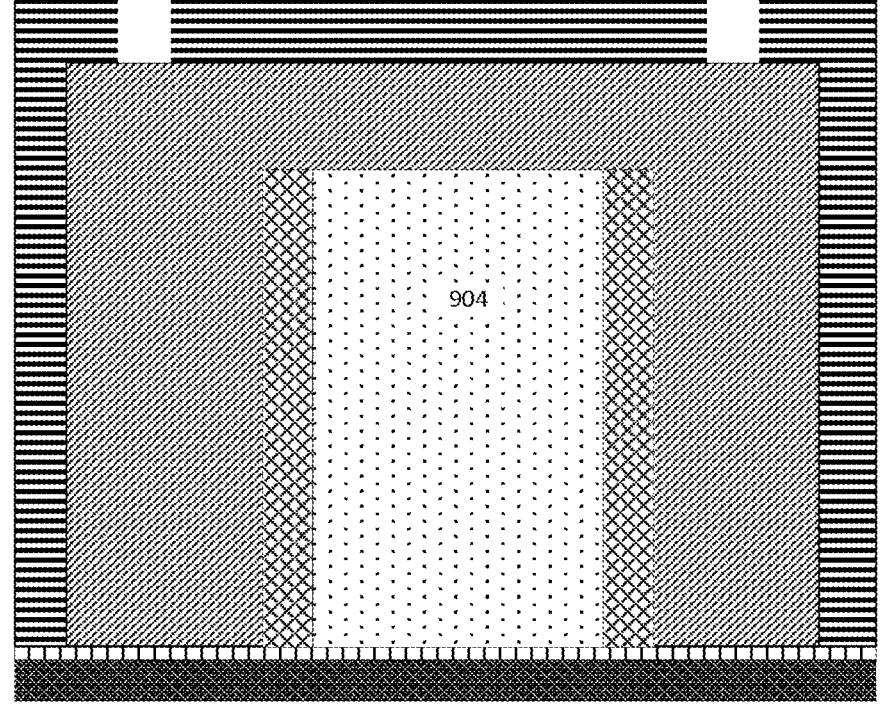
Figure 9G:
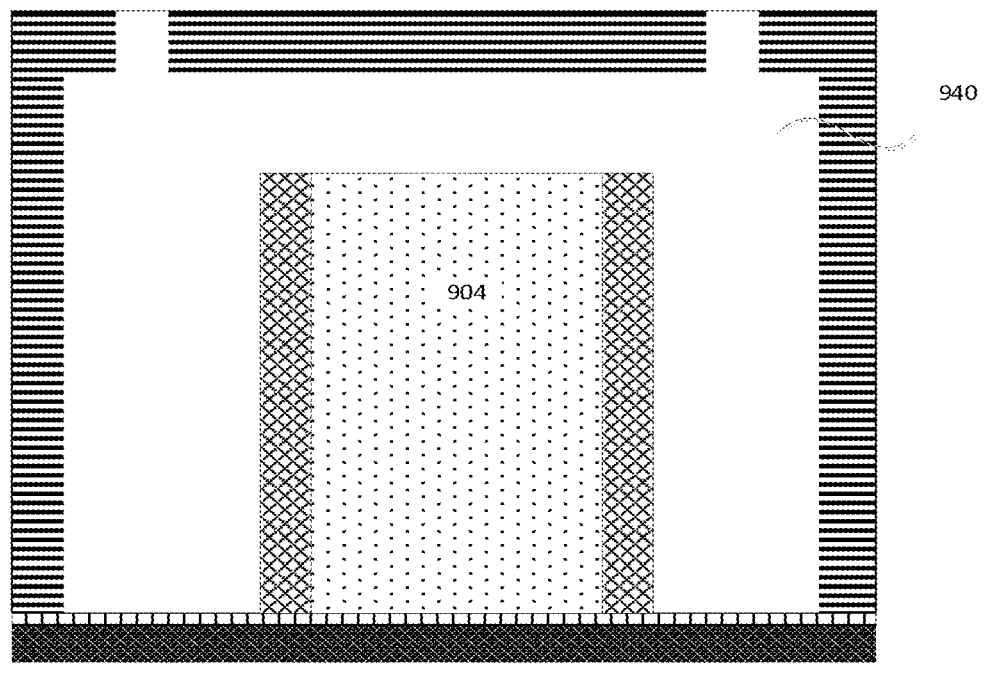

At step 9003, selectively remove the sacrificial layer, as shown in FIG. 9F and FIG. 9G. The sacrificial layer 932 is exposed by vertical etching on the protective layer 930 to form multiple contact holes, and the sacrificial layer 932 is removed by techniques such as wet etching without affecting other structures.

At step 9004, close the protective layer to form a chamber structure, as shown in FIG. 9B. In some embodiments, the epitaxial growth of $SiO_2$ or SiN closes the contact holes formed on the protective layer 920. Due to the selective growth characteristic of epitaxial growth, $SiO_2$ or SiN is formed on the protective layer, to close the contact holes to form a structure similar to FIG. 9B. As is well known to a person skilled in the art, other existing methods of forming empty cavity structures by closing a protective layer may also be applied herein.

It is well known to a person skilled in the art that, in addition to the methods recited in this embodiment, other methods also exist in the prior art for forming empty cavities on both sides of the piezoelectric layer to form an FBAR-like structure. Such a method is also included within the scope of this invention.

Figure 10A:
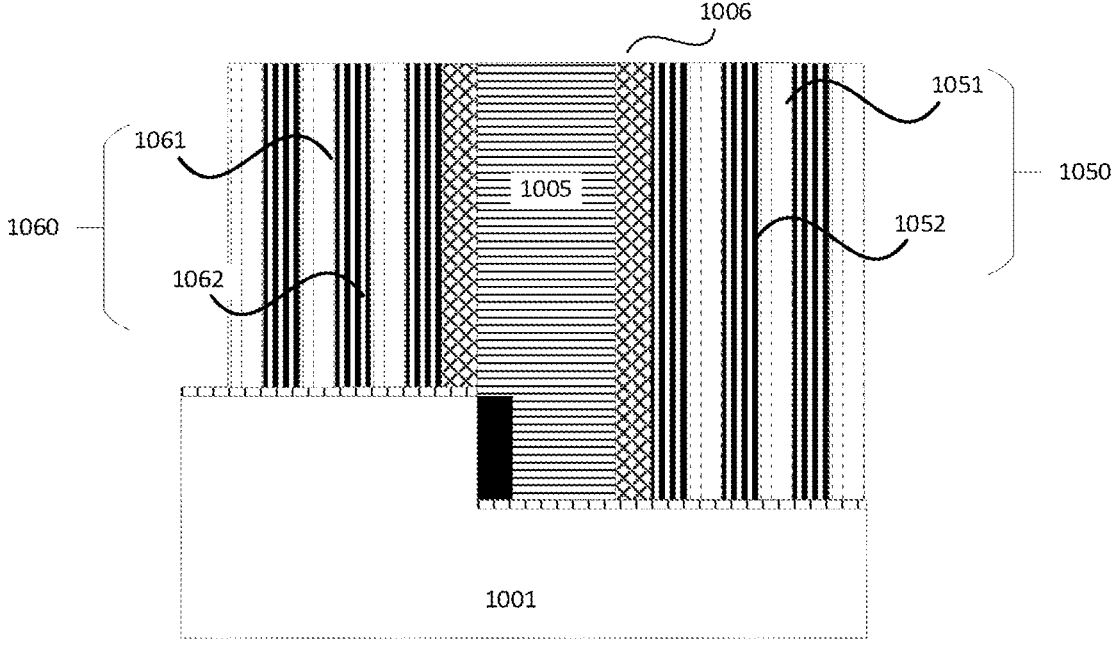
FIG. 10A to FIG. 10D are schematic structural diagrams of multiple BAW filters according to embodiments of this invention.

FIG. 10A is a schematic structural diagram of a BAW filter according to another embodiment of this invention. Similar to the embodiment in FIG. 1A, both sides of the filter of this embodiment are added with the acoustic reflectors, such as Bragg reflectors. The same parts as the embodiment in FIG. 1A are not repeated herein.

The filter of FIG. 10A includes a first Bragg reflector 1050 outside the first vertical face 1006. As shown in the drawing, the Bragg reflector 1050 includes multiple layers of alter-nating impedance layers 1051 and 1052, where the first layer 1051 has a large acoustic impedance, the second layer 1052 has a small acoustic impedance, the third layer 1051 has a large acoustic impedance, and so on; moreover, the thick-ness of each layer is a quarter of the wavelength of the acoustic wave, that is, $\lambda/4$. In this way, most of the waves would be reflected back and superimposed on the original wave. An overall effect of this structure is equivalent to contact with air, and most of the acoustic waves are com-pressed into the piezoelectric layer 1005. Since both the thickness of the piezoelectric material and the thickness of the impedance layer can be defined very precisely by the way of lithography, and the manufacturing process is also a mature process, the filters of some embodiments of this invention have higher quality factors and lower insertion losses. Similarly, the filter in FIG. 10A includes a second Bragg reflector 1060 outside the second vertical face, which can also reflect most of the acoustic wave back and compress same into the piezoelectric layer 105.

Figure 10B:
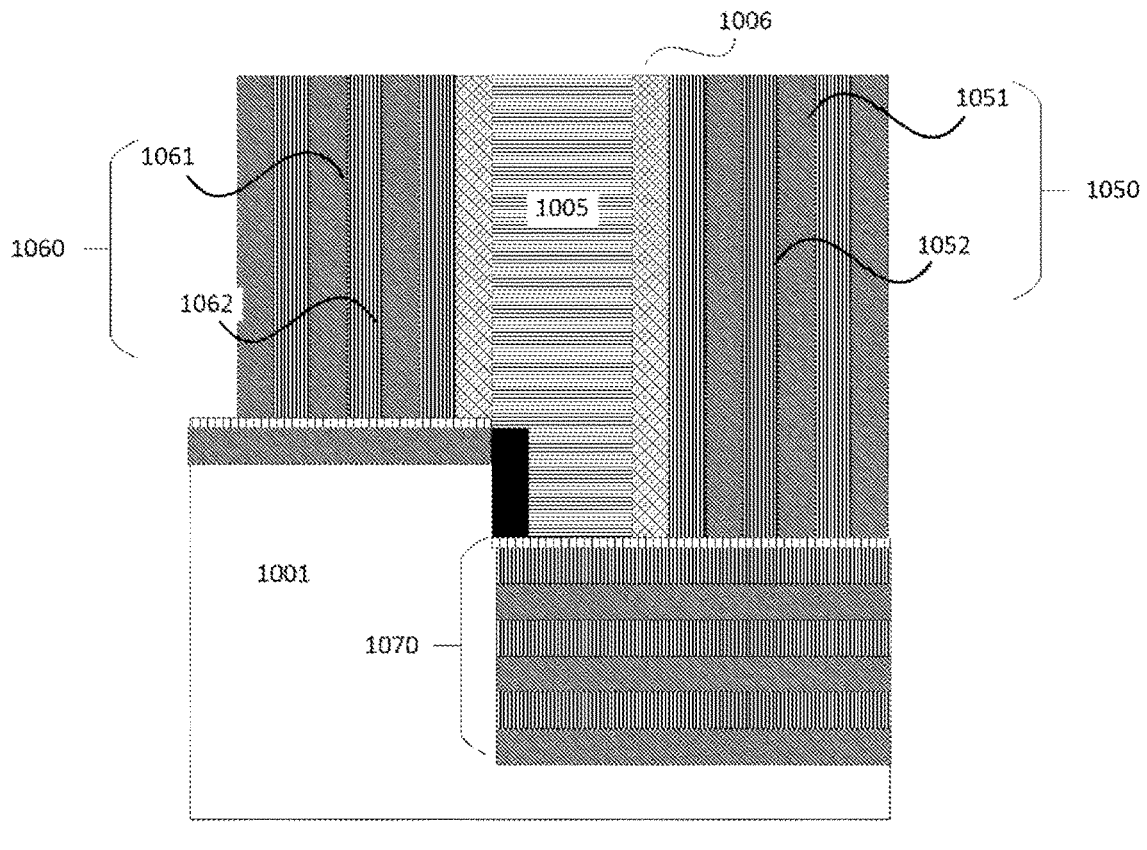

FIG. 10B is a schematic structural diagram of a BAW filter according to another embodiment of this invention. Similar to the filter structure of FIG. 10A, except that a third Bragg reflector 1070 is included below the piezoelectric layer 105. The third Bragg reflector 1070 covers a lower surface of the piezoelectric layer 105, which can also reduce the vertical direction energy loss of the device.

Figure 10C:
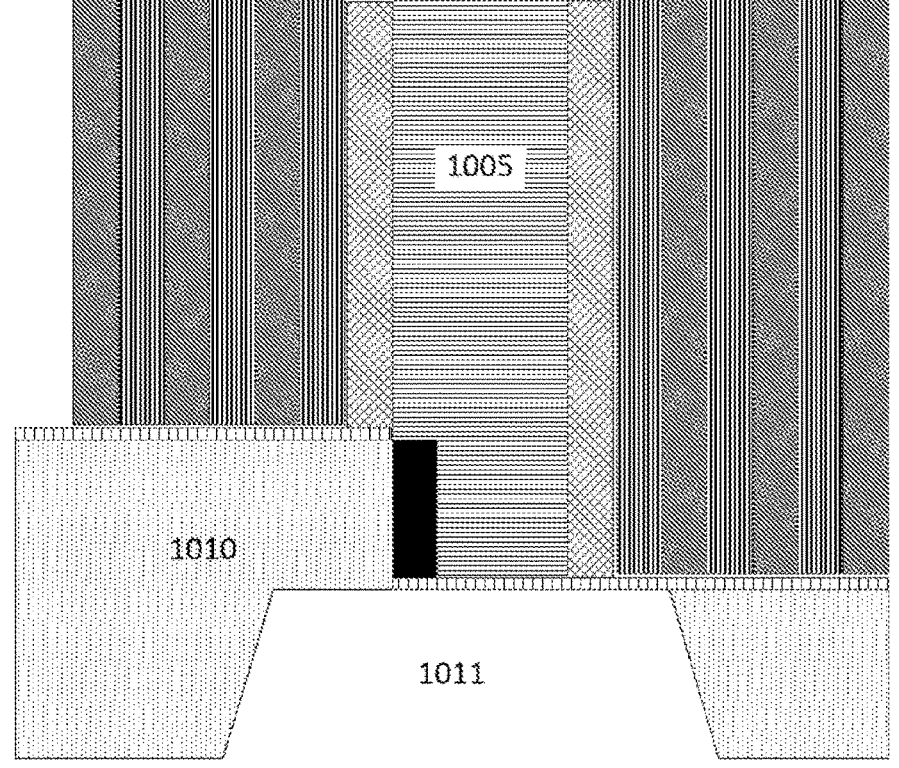

FIG. 10C is a schematic structural diagram of a BAW filter according to another embodiment of this invention. Similar to the filter structure of FIG. 10A, except that an empty cavity is disposed below the piezoelectric layer 105. In some embodiments, below the piezoelectric layer 105 in FIG. 10C, it may be a substrate structure, or may also be other substrate structures such as a flexible base. The pres-ence of the empty cavities can also reduce the vertical direction energy loss of the device.

Figure 10D:
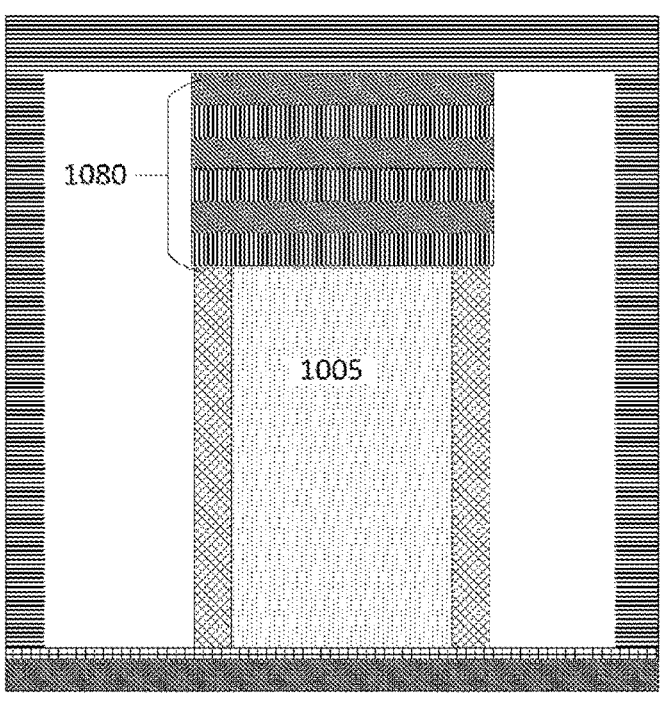

FIG. 10D is a schematic structural diagram of a BAW filter according to another embodiment of this invention. Similar to the filter structure of FIG. 9B, except that a fourth Bragg reflector 1080 is disposed above the piezoelectric layer 105. In this way, the fourth Bragg reflector 1080 covers an upper surface of the piezoelectric layer 105, which can also reduce the vertical direction energy loss of the device.

The vertical structure of the filter of this invention brings many conveniences in electrode interconnection. The con-venience and flexibility of the electrical interconnection of this invention are illustrated by several embodiments below.

Figure 11A:
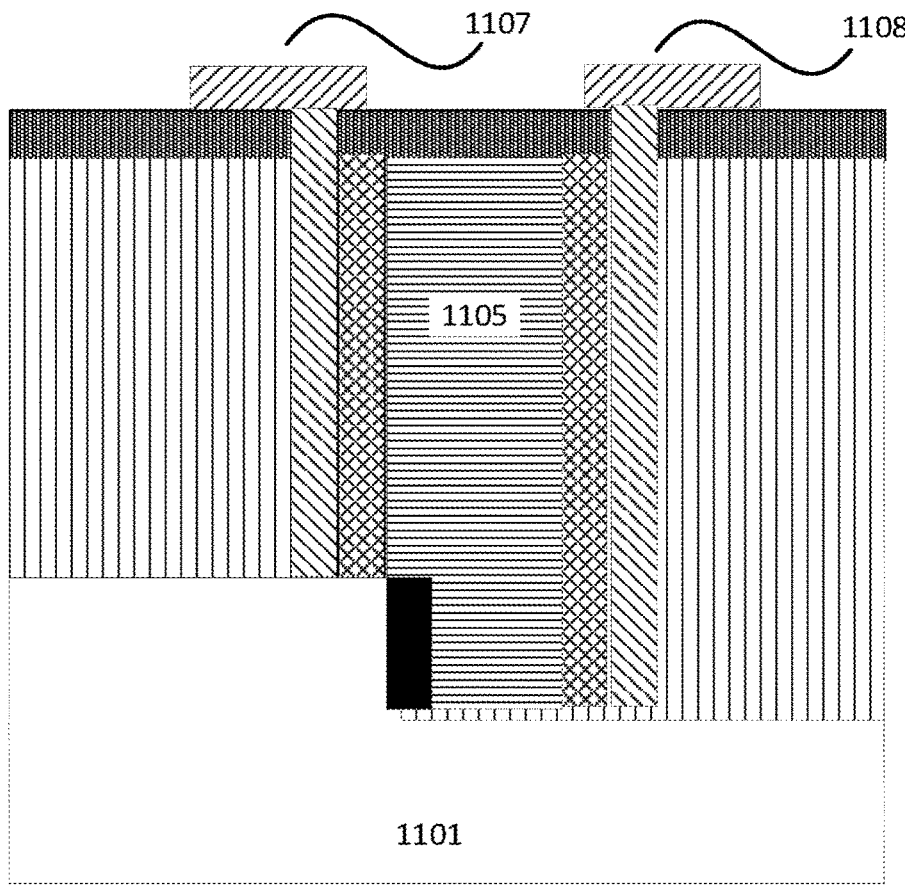
FIG. 11A to FIG. 11C are schematic structural diagrams of electrode lead of multiple BAW filters according to embodiments of this invention.
Figure 11B:
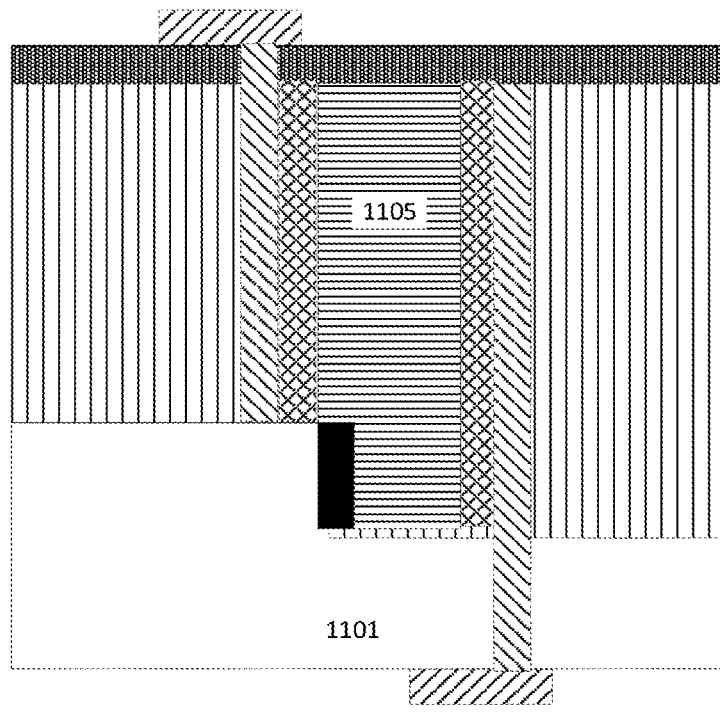
Figure 11C:
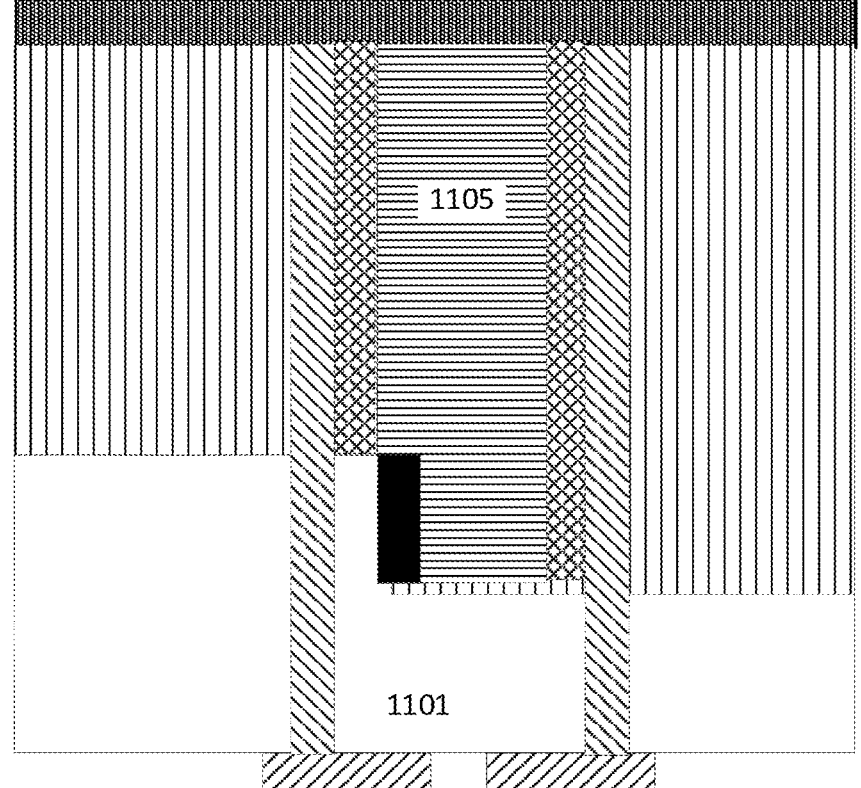

FIG. 11A to FIG. 11C are schematic diagrams of different electrode lead modes of a BAW filter according to embodi-ments of this invention. As shown in FIG. 11A, the first electrode 1107 and the second electrode 1108 of the BAW filter can be simultaneously led out from above and electri-cally interconnected with other devices. As shown in FIG. 11B, the first electrode 1107 on one side of the BAW filter can be led out from above, and the second electrode 1108 on the other side can be led out from below, and then electri-cally interconnected with other devices. As shown in FIG. 11C, the first electrode 1107 and the second electrode 1108 of the BAW filter can be simultaneously led out from below.

Figure 12A:
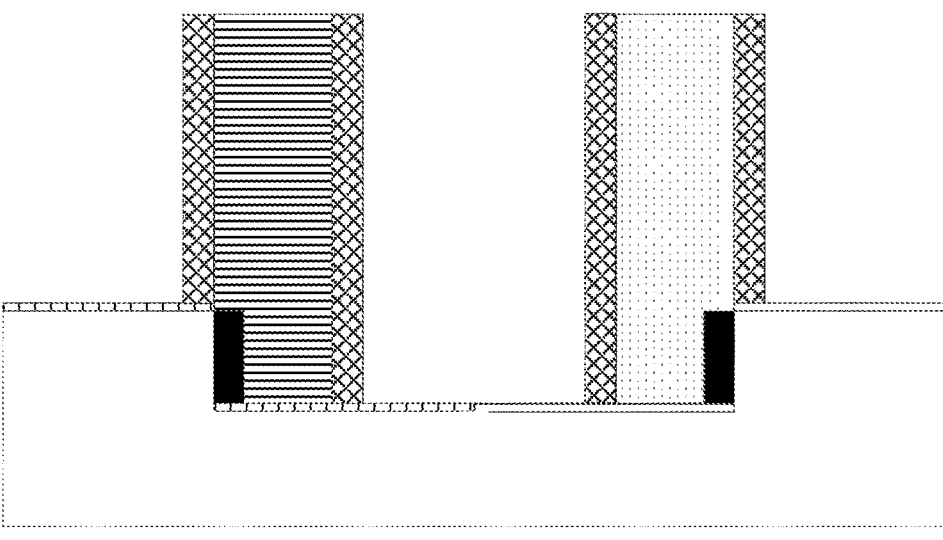
FIG. 12A is a schematic structural diagram of a BAW filter according to an embodiment of this invention.
Figure 12B:
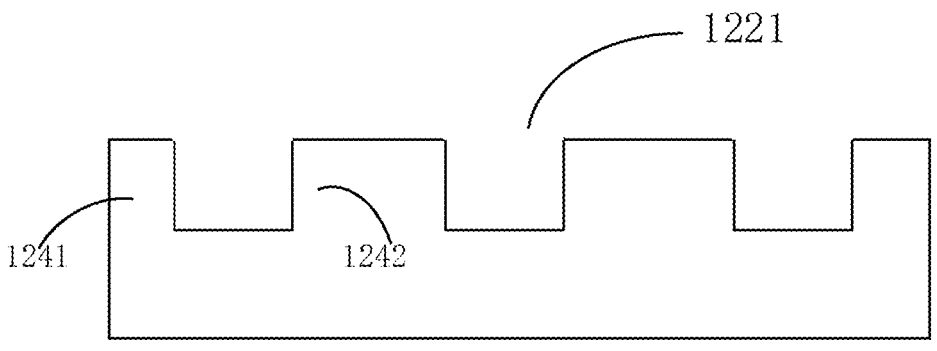
FIG. 12B and FIG. 12C are schematic diagrams of preparation steps of a BAW filter according to an embodiment of this invention.
Figure 12C:
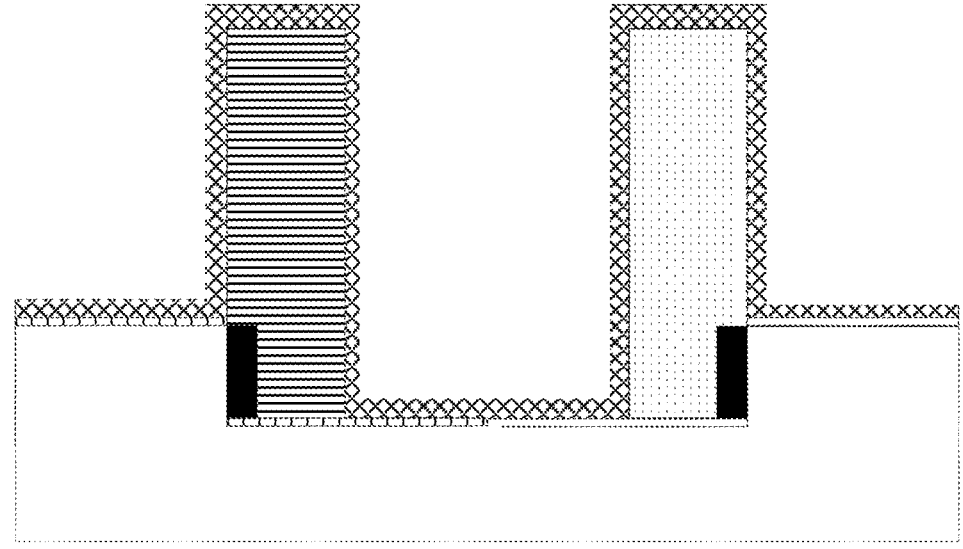

FIG. 12A is a schematic structural diagram of a BAW filter according to an embodiment of this invention. In the structure of this embodiment, it can be more convenient to set the electrodes and make electrical connections between individual devices. In some embodiments, in the process of manufacturing the BAW filter shown in FIG. 12A on the substrate shown in FIG. 12B, after forming the piezoelectric layer, the conductive layer can be deposited for once, as shown in FIG. 12C. In the subsequent process, the electrode style can be selected according to actual needs. For example, if the conductive layer between the two devices is maintained unchanged, a natural electrical connection is formed between the two devices.

Figure 12D:
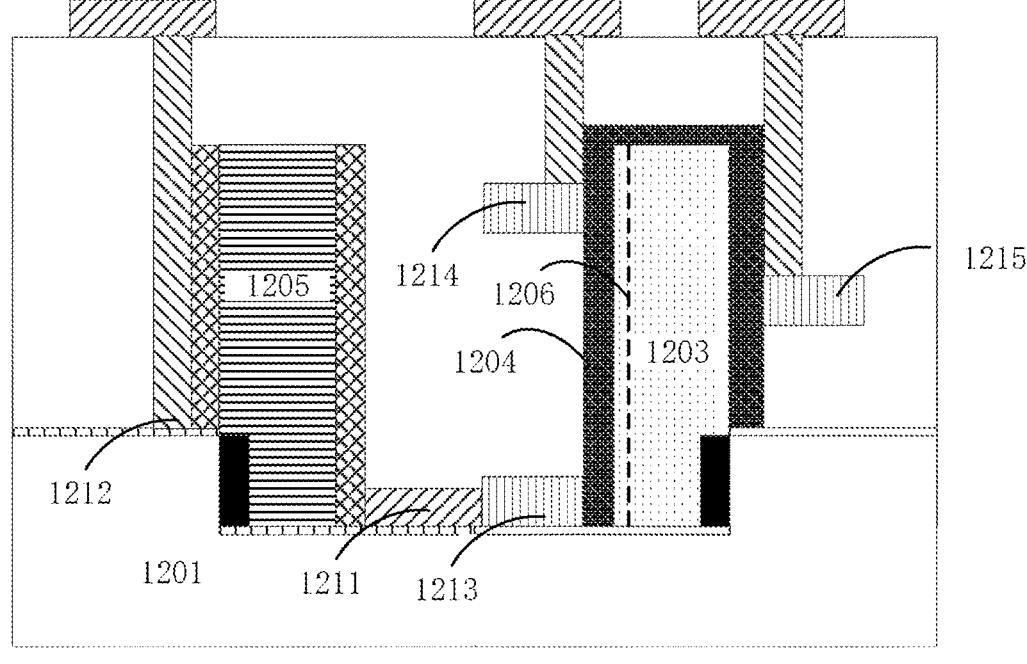
FIG. 12D is a schematic diagram of integration of a BAW filter and HEMT according to an embodiment of this invention.

FIG. 12D is a schematic structure diagram of the electric interconnection after the integration of a BAW filter and HEMT according to an embodiment of this invention. As shown in the drawing, the substrate 1201 includes a BAW filter on the left side and an HEMT on the right side. The BAW filter includes a piezoelectric layer 1205, leading electrodes 1211 and 1212, and other structures; and the HEMT includes a channel layer 1203, a channel providing layer 1204, a two-dimensional electron gas 1206, a first electrode 1213, a second electrode 1214, and a third electrode 1215. The leading electrode 1211 and electrode 1213 can be electrically interconnected with each other or without electrical connection. In the structure, the electrode 1215 can exhaust two-dimensional electron gas 1206, so that the first electrode 1213 and the second electrode 1214 are cut off. The electrode 1215 controls the on or cutoff of the HEMT. When an electrical connection is formed between the leading electrode 1211 and the electrode 1213, the electrical signal can enter through the electrode 1214, pass through the two-dimensional electron gas to the BAW filter, and exit (or reversely transmitting) from the electrode 1212. In this way, the HEMT device forms the control of the BAW device. In a similar manner, the filter of this invention can be conveniently integrated with other devices in the same chip.

Figure 13A:
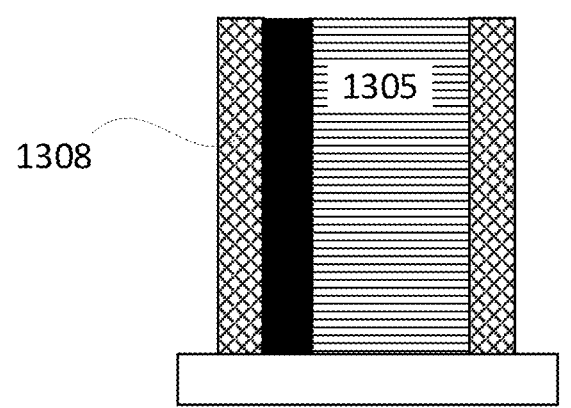
FIG. 13A is a schematic structural diagram of a BAW filter according to an embodiment of this invention.
Figure 13B:
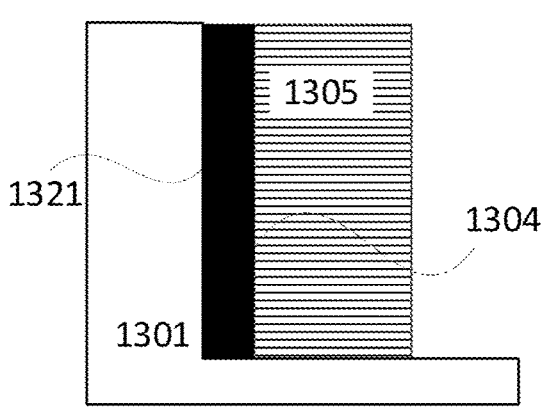
FIG. 13B and FIG. 13C are schematic diagrams of preparation steps of a BAW filter according to an embodiment of this invention.
Figure 13C:
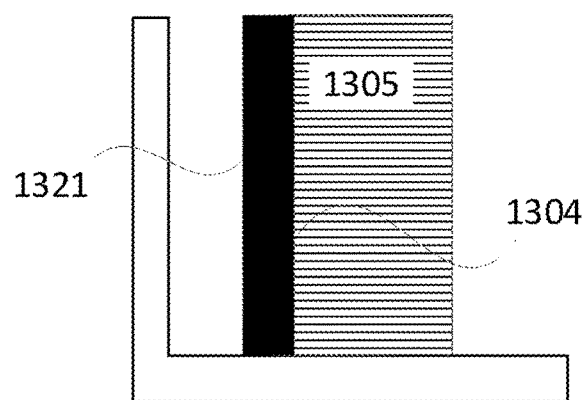

FIG. 13A is a schematic structural diagram of a BAW filter according to an embodiment of this invention. In this embodiment, the difference from the structure in FIG. 1A is that the piezoelectric layer is mainly grown in the horizontal direction, and the formed piezoelectric layer has higher lattice consistency and the device performance is more stable. In some embodiments, the structure of FIG. 13B is first formed (for example, according to the preceding method). Then the left side empty cavity is vertically etched on the substrate, as shown in FIG. 13C. Next, a metal electrode is deposited (processes such as electron beam evaporation, atomic layer deposition, magnetron sputtering, and physical vapor deposition (PVD)), and then vertically non-selective etching is conducted to form the electrode. In some embodiments, the preceding method can be referred to to form the preceding structure device.

Figure 14A:
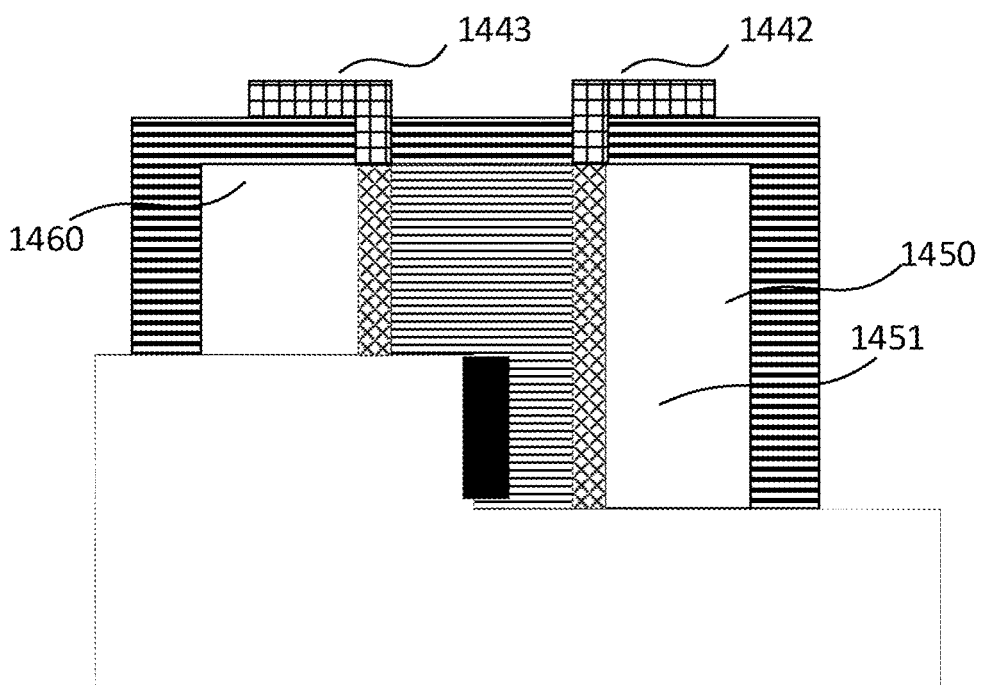
FIG. 14A to FIG. 14D are schematic structural diagrams of multiple BAW filters according to embodiments of this invention.
Figure 14B:
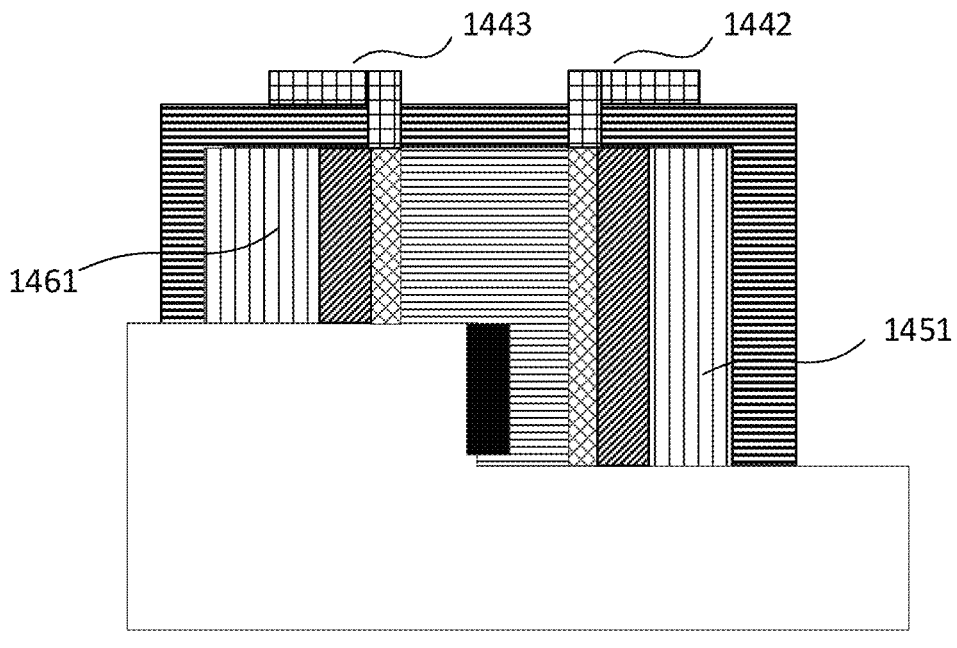
Figure 14C:
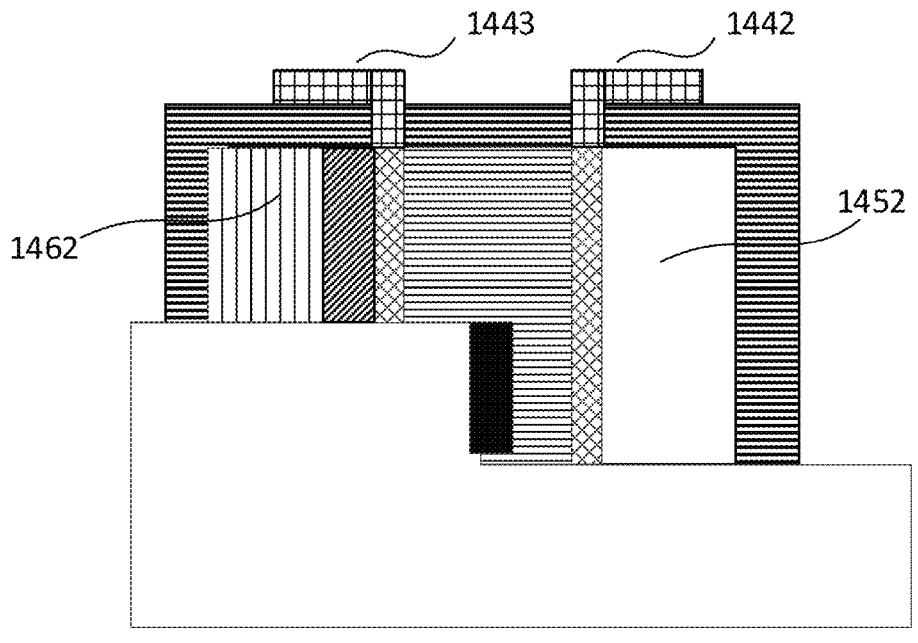
Figure 14D:
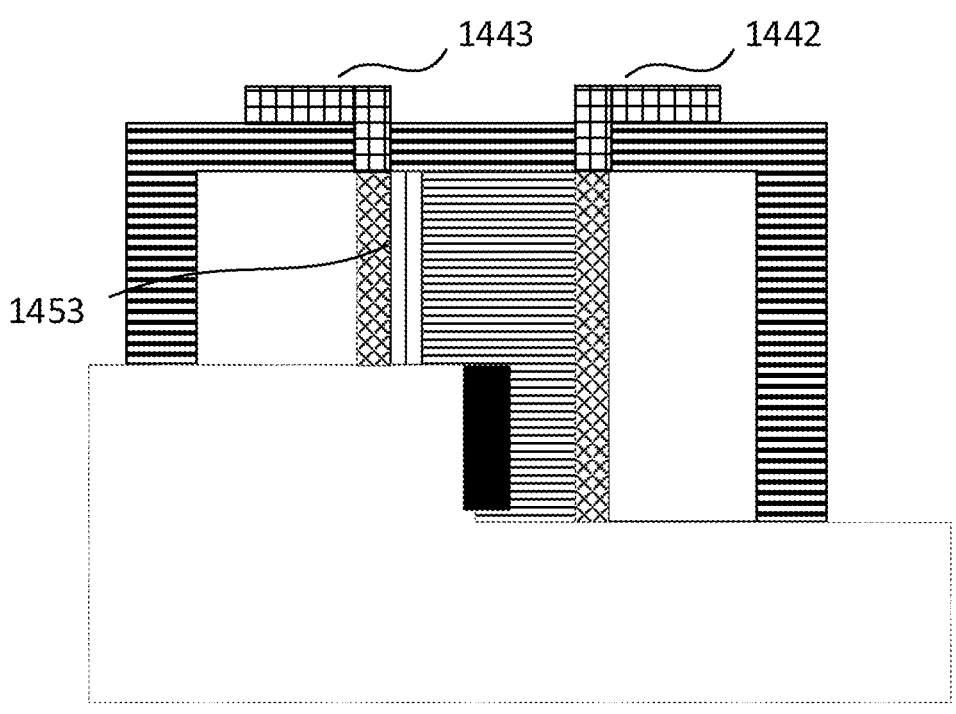

FIG. 14A to FIG. 14D are schematic structural diagrams of multiple BAW filters according to embodiments of this invention. The structure shown in FIG. 14A includes a first empty cavity 1450, a second empty cavity 1460, a first leading electrode 1442, and a second leading electrode 1443. For the filter as a whole, the left and right sides are symmetric structures. The structure shown in FIG. 14B includes a first Bragg reflector 1451 and a second Bragg reflector 1461. For the filter as a whole, the left and right sides are also symmetric structures. The structure shown in FIG. 14C includes the first empty cavity 1452 at the left side and the first Bragg reflector 1462 on the right side. The filter is an asymmetric structure. In some embodiments, the structure shown in FIG. 14D is similar to FIG. 14A, except that a superimposed layer 1453 is included between the electrode and the piezoelectric layer. The superimposed layer 1452 is opposite to the piezoelectric layer temperature coefficient to compensate for the negative temperature coefficient of the piezoelectric layer and the metal layer.

Figure 15:
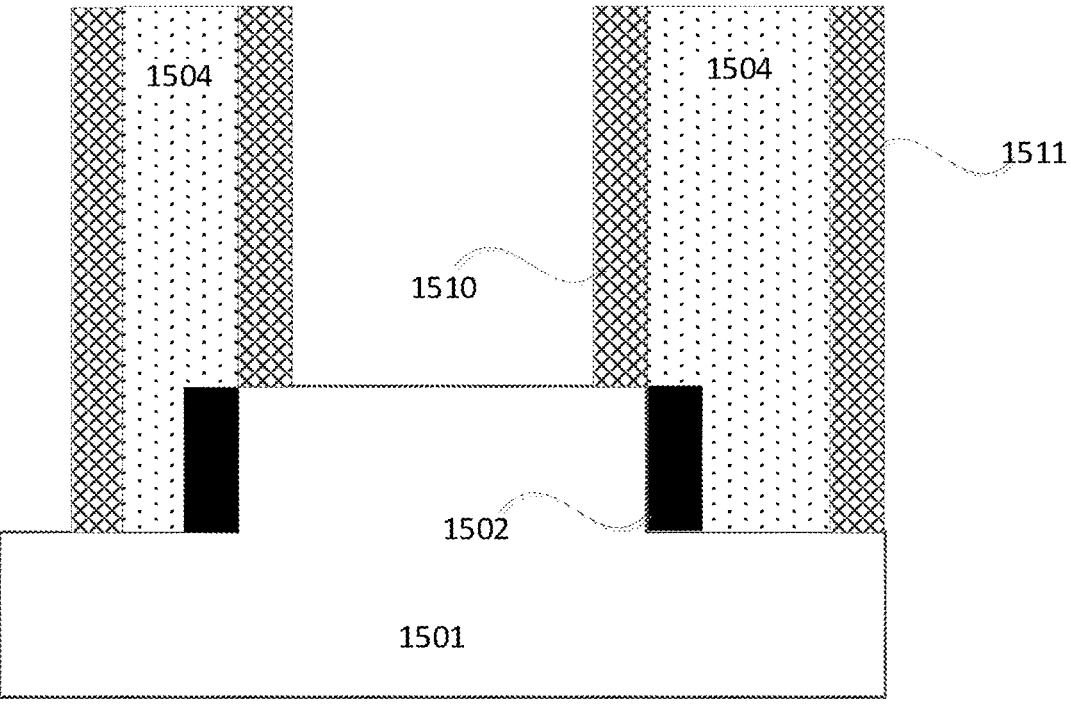
FIG. 15 is a schematic structural diagram of a BAW filter according to an embodiment of this invention.

FIG. 15 is a schematic structural diagram of a BAW filter according to an embodiment of this invention. As shown in the drawing, two devices with different piezoelectric layer widths (i.e., different distances between electrodes) can be formed on the same substrate, so that BAW filters of different frequencies can be integrated on the same substrate. It is understood by a person skilled in the art that multiple filters of the same or different frequencies may be integrated on a single chip in the same manner, and the filters share the same substrate or support layer. In some embodiments, the filter group formed by these filters can form filter networks of different configurations.

Figure 16A:
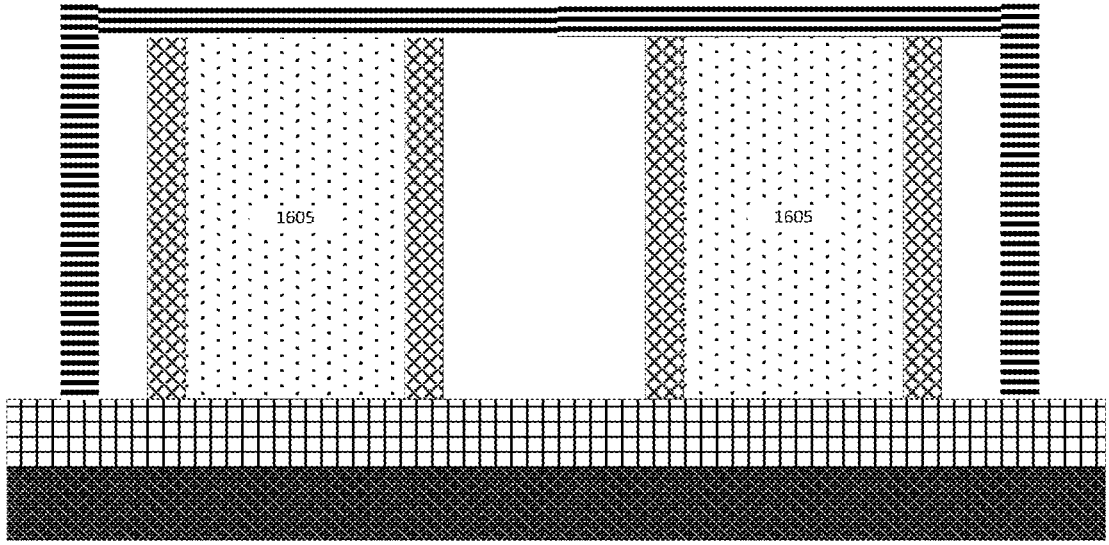
FIG. 16A and FIG. 16B are schematic structural diagrams of two BAW filters according to embodiments of this invention.
Figure 16B:
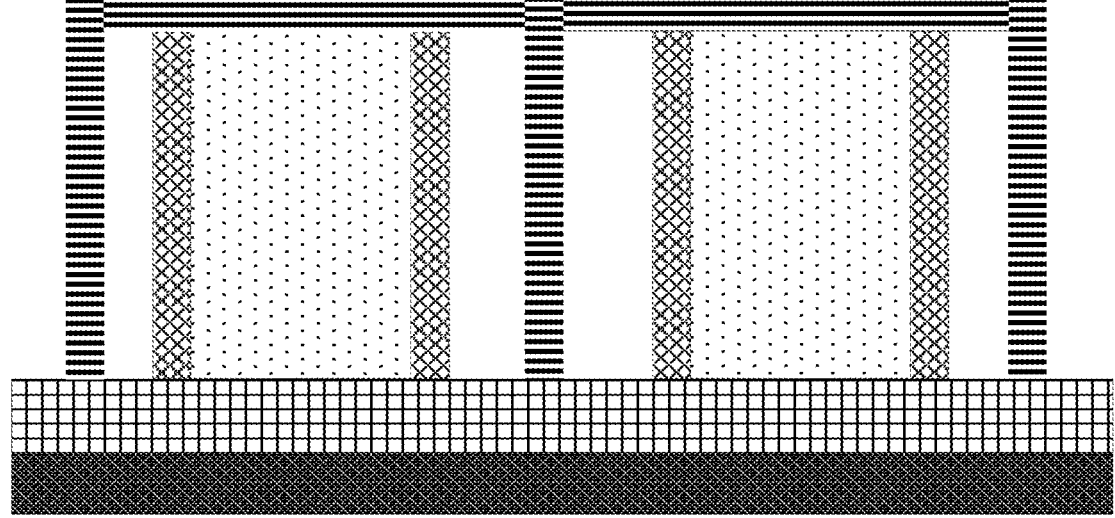

FIG. 16A and FIG. 16B are schematic structural diagrams of two BAW filters according to embodiments of this invention. FIG. 16A and FIG. 16B are two different shell layer setting modes, that is, more than two devices can be set in the same shell layer, or can also be set in different shell layers.

Figure 17A:
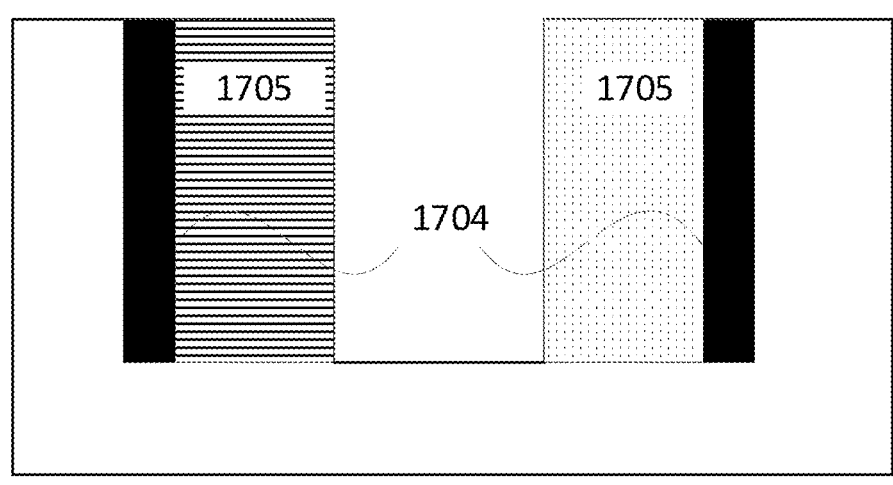
FIG. 17A and FIG. 17B are schematic structural diagrams of two BAW filters according to embodiments of this invention.
Figure 17B:
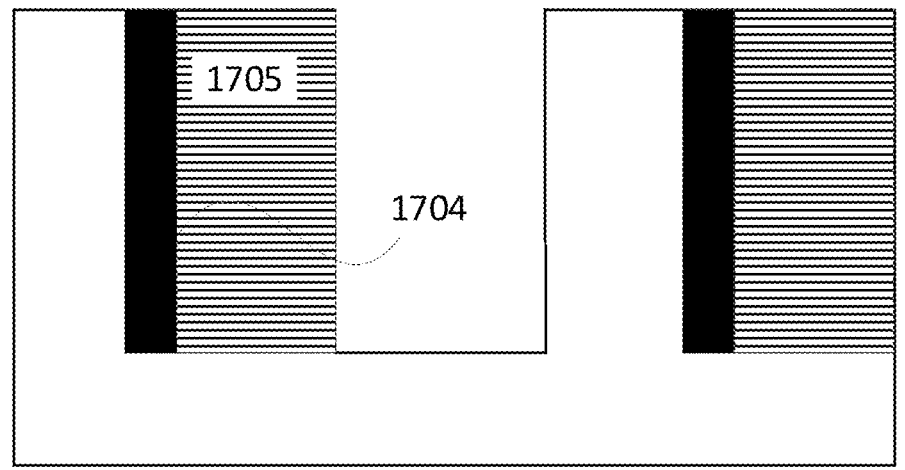
Figure 17C:
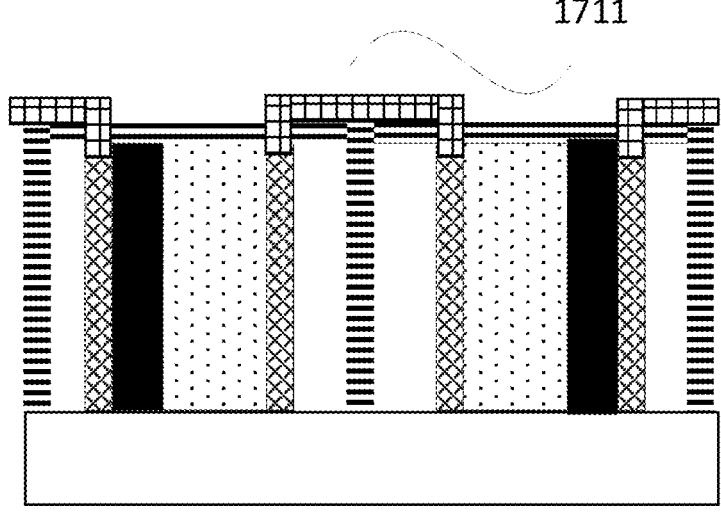
FIG. 17C and FIG. 17D are schematic structural diagrams of electrode lead of multiple BAW filters according to embodiments of this invention.
Figures 17D, 18A:
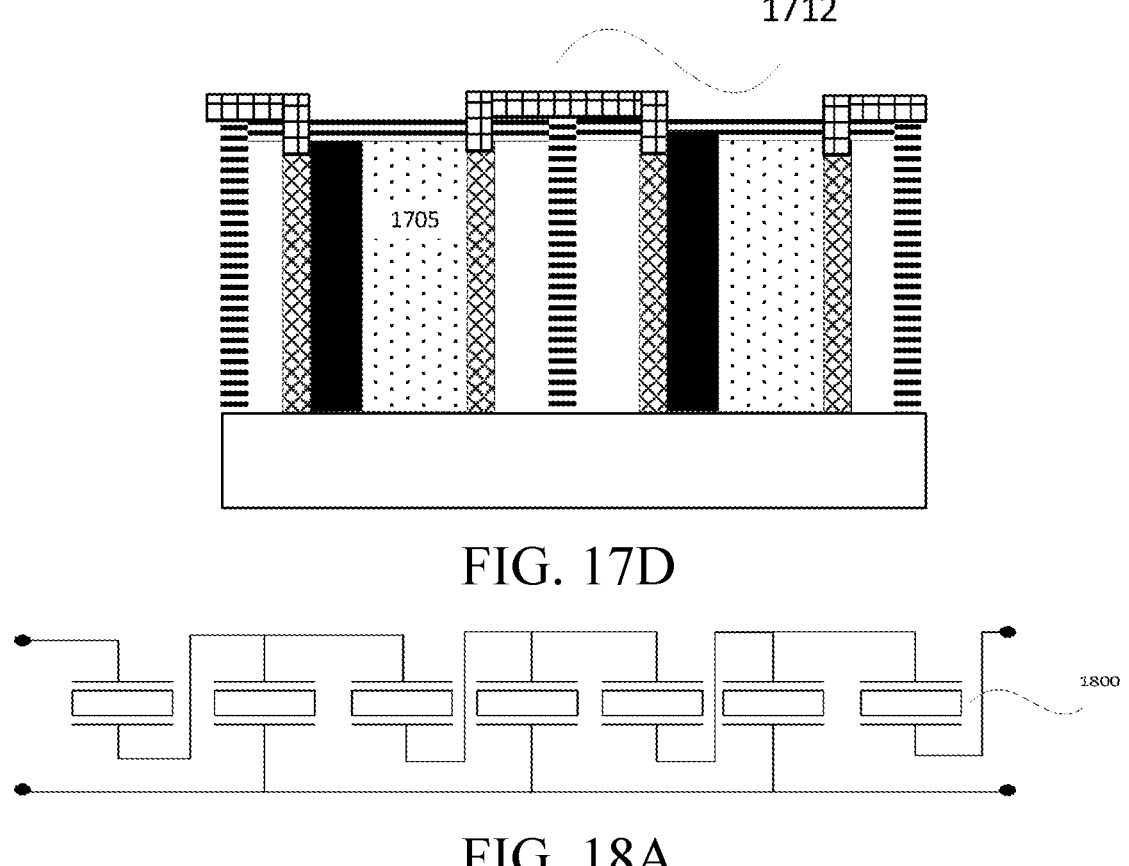
FIG. 18A to FIG. 18C are schematic diagrams of a BAW filter network topology configuration.

FIG. 17A and FIG. 17B are schematic structural diagrams of BAW filters according to embodiments of this invention. FIG. 17A and FIG. 17B are both embodiments of all transverse growth of piezoelectric layers; however, in the embodiment of FIG. 17A, adjacent piezoelectric layers are formed in the same trench by growing in opposite directions; moreover, in the embodiment of FIG. 17B, adjacent piezoelectric layers are formed in different trenches in the same direction. The embodiment of FIG. 17A facilitates the formation of a serial filter structure; the embodiment of FIG. 17B facilitates the formation of a parallel filter structure. Similarly, FIG. 17C and FIG. 17D are schematic structural diagrams of BAW filter groups according to embodiments of this invention. In the embodiment of FIG. 17C, adjacent filters are formed in different chambers by growing in opposite directions, which facilitates the formation of a serial filter structure. In the embodiment of FIG. 17D, adjacent filters are formed in different chambers by growing in the same direction, which facilitates the formation of a parallel filter structure.

Figures 18B, 18C:
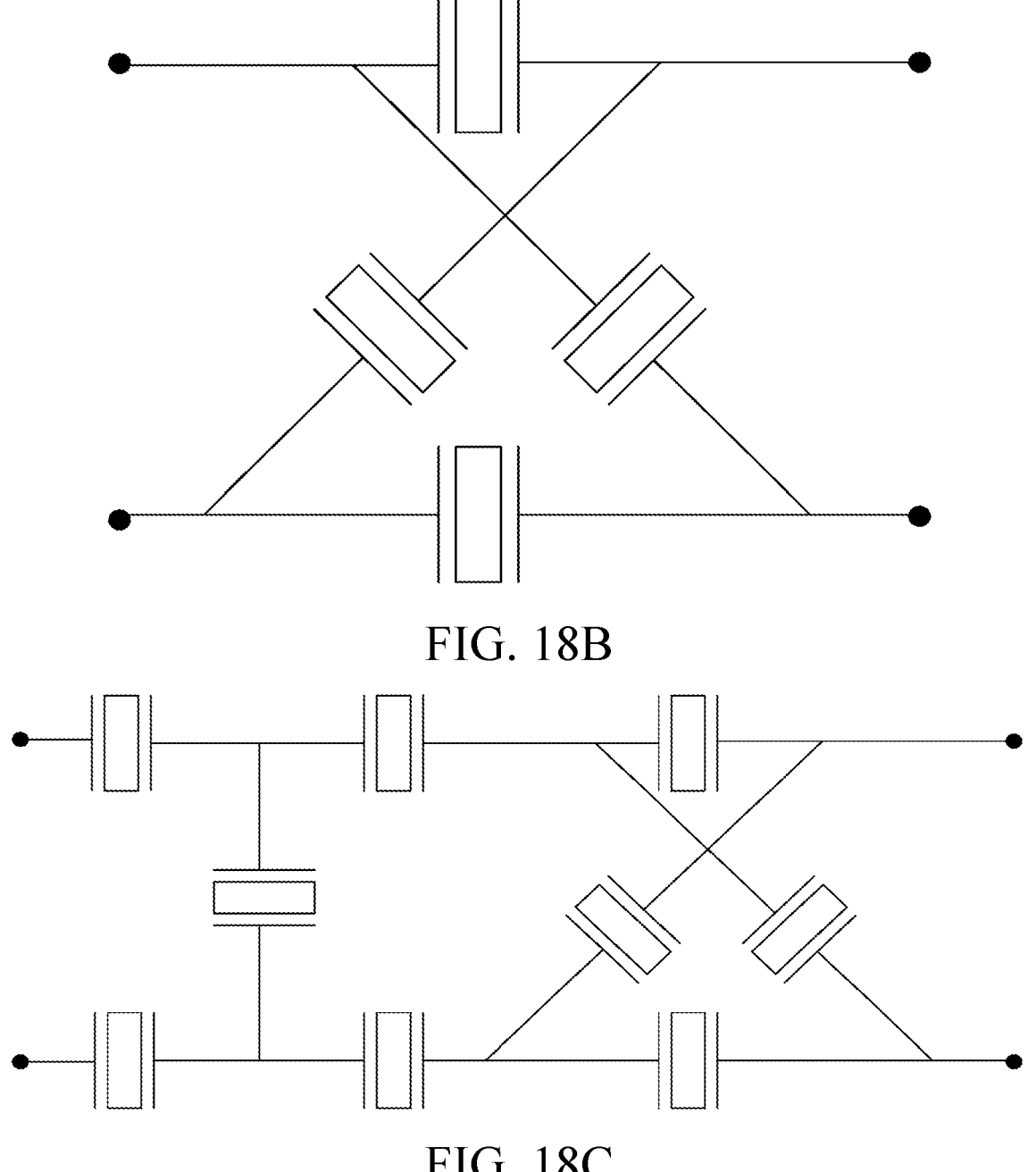

FIG. 18A to FIG. 18C are schematic diagrams of a topological structure of a BAW filter group. FIG. 18A is a trapezoidal topology configuration, which is a non-equilibrium topological structure. FIG. 18B is a lattice topology configuration, which is a balanced topological structure. FIG. 18C is a trapezoid-lattice topology configuration. Different topological structures have respective advantages and disadvantages. In order to obtain the required bandwidth, a shunt component is adjusted to a lower frequency than a voltage division component, and out-of-band suppression is determined by the number of components and a static capacitance voltage divider. The most appropriate topological structure can be selected for the desired suppression function. As understood by a person skilled in the art, the filter group of this invention can realize filter networks in trapezoidal, lattice, and trapezoid-lattice topology configurations on the same chip.

As understood by a person skilled in the art, multiple filters of the same or different frequencies of this invention can be integrated on a single chip with semiconductor components such as other transistors (for example, HEMT). These semiconductor components, such as filters and transistors, share the same substrate or support layer and can form highly integrated semiconductor devices.

The embodiments above are only for the purpose of explaining this invention and are not limitations to this invention. A person of ordinary skills in the relevant technical field can also make various changes and variations without departing from the scope of this invention. Therefore, all equivalent technical solutions shall also belong to the scope disclosed by this invention.

The invention claimed is:

1. A filter, comprising:
a piezoelectric layer;
a first electrode, disposed at a first vertical face of the piezoelectric layer and configured to receive an electric signal;
a second electrode, disposed at a second vertical face of the piezoelectric layer and configured to output an electric signal, wherein the first vertical face and the second vertical face are two opposite sides of the piezoelectric layer; and
a substrate comprising a vertical interface;
wherein a material of the piezoelectric layer is AlN or ZnO and the piezoelectric layer is formed by epitaxial growth of the vertical interface.

2. The filter of claim 1, wherein the substrate is a Si substrate, and the vertical interface is a Si (111) face; the substrate is a $Al_2O_3$ sapphire substrate, and the vertical interface is a $Al_2O_3$ (0001) face; the substrate is a SiC substrate, and the vertical interface is a SiC (0001) or (000-1) face; or the substrate is a GaN intrinsic substrate, and the vertical interface is a GaN intrinsic substrate (0001) or (000-1) face.

3. The filter of claim 1, further comprising a thermal conductive layer, wherein the substrate is between the piezoelectric layer and the thermal conductive layer.

4. The filter of claim 1, wherein the substrate is subjected to a thinning treatment; or the thickness of the substrate is 500-3000 nm.

5. The filter of claim 1, wherein a buffer layer is comprised between the vertical interface of the substrate and the piezoelectric layer.

6. The filter of claim 5, wherein the piezoelectric layer is disposed above the buffer layer.

7. The filter of claim 1, further comprising a support layer, wherein the first vertical interface and the second vertical interface of the piezoelectric layer are roughly vertical to the support layer.

8. The filter of claim 7, wherein the support layer comprises a high thermal conductivity material.

9. The filter of claim 7, wherein the support layer comprises a metal or graphene.

10. The filter of claim 1, wherein outside the first vertical interface, a first acoustic reflector or a first empty cavity is comprised.

11. The filter of claim 1, wherein outside the second vertical interface, a second acoustic reflector or a second empty cavity is comprised.

12. The filter of claim 1, wherein above or below the piezoelectric layer, a third acoustic reflector or a third empty cavity is comprised.

13. The filter of claim 1, wherein the first electrode is electrically interconnected with the second electrode above the piezoelectric layer.

14. The filter of claim 1, wherein the first electrode is electrically interconnected with the second electrode respectively above and below the piezoelectric layer.

15. The filter of claim 1, wherein the first electrode is electrically interconnected with the second electrode below the piezoelectric layer.

16. A filter network, comprising:
a plurality of filters of claim 1, wherein the plurality of filters are integrated on a single chip.

17. The filter network of claim 16, wherein the plurality of filters share a same substrate or support layer.

18. The filter network of claim 16, wherein the plurality of filters form a trapezoid configuration, a lattice configuration, or a trapezoid-lattice configuration.

19. A semiconductor device, comprising:
one or more filters of claim 1; and
one or more transistors;
wherein one or more filters and the one or more transistors are integrated on a single chip.

20. The semiconductor device of claim 19, wherein the one or more filters and the one or more transistors share a same substrate or support layer.

21. The semiconductor device of claim 19, wherein the one or more transistors comprise a HEMT or HHMT.

22. The semiconductor device of claim 19, wherein the HEMT or HHMT comprises a channel layer and a channel providing layer vertically disposed.

* * * * *